US008101236B2

(12) United States Patent
Edelstein et al.

(10) Patent No.: US 8,101,236 B2
(45) Date of Patent: Jan. 24, 2012

(54) METHOD OF FABRICATING A SICOH DIELECTRIC MATERIAL WITH IMPROVED TOUGHNESS AND IMPROVED SI-C BONDING

(75) Inventors: Daniel C. Edelstein, White Plains, NY (US); Stephen M. Gates, Ossining, NY (US); Alfred Grill, White Plains, NY (US); Michael Lane, Cortlandt Manor, NY (US); Qinghuang Lin, Mt. Kisco, NY (US); Robert D. Miller, San Jose, CA (US); Deborah A. Neumayer, Danbury, CT (US); Son Van Nguyen, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 319 days.

(21) Appl. No.: 12/355,316

(22) Filed: Jan. 16, 2009

(65) Prior Publication Data

US 2009/0181178 A1      Jul. 16, 2009

Related U.S. Application Data

(63) Continuation of application No. 11/132,108, filed on May 18, 2005, now Pat. No. 7,479,306, which is a continuation-in-part of application No. 11/040,778, filed on Jan. 21, 2005, now Pat. No. 7,892,648.

(51) Int. Cl.
    *C23C 16/40* (2006.01)
(52) U.S. Cl. ......... 427/255.29; 427/255.31; 427/255.37; 427/535; 427/551; 427/553

(58) Field of Classification Search ............... 427/249.1, 427/249.15, 255.29, 255.31, 255.37, 535, 427/551, 553
See application file for complete search history.

(56) References Cited

U.S. PATENT DOCUMENTS

| 5,679,755 | A | * | 10/1997 | Mager et al. | ............... | 528/35 |
| 6,059,553 | A | | 5/2000 | Jin et al. | | |
| 6,147,009 | A | * | 11/2000 | Grill et al. | ............... | 438/780 |
| 6,312,793 | B1 | | 11/2001 | Grill et al. | | |
| 6,368,535 | B1 | | 4/2002 | Katsoulis et al. | | |
| 6,437,443 | B1 | | 8/2002 | Grill et al. | | |

(Continued)

FOREIGN PATENT DOCUMENTS

CN       1454394       11/2003

(Continued)

OTHER PUBLICATIONS

Chao, Ye, et al., "Influence of Si-OH groups on properties and avoidance for SiCOH films prepared by decamethylcyclopentasiloxane electron cyclotron resonance plasma". Acta Physica Sinica May 2006. Abstract only.*

(Continued)

*Primary Examiner* — Bret Chen
(74) *Attorney, Agent, or Firm* — Scully, Scott, Murphy & Presser, P.C.; Louis J. Percello, Esq.

(57) ABSTRACT

A method of fabricating a low-k dielectric material with increased cohesive strength for use in electronic structures including interconnect and sensing structures is provided. The method includes the deposition of the dielectric material from a first precursor which is an carbosilane or an alkoxycarbosilane molecule.

24 Claims, 8 Drawing Sheets

U.S. PATENT DOCUMENTS

| | | |
|---|---|---|
| 6,441,491 B1 | 8/2002 | Grill et al. |
| 6,479,110 B2 | 11/2002 | Grill et al. |
| 6,497,963 B1 | 12/2002 | Grill et al. |
| 6,541,398 B2 | 4/2003 | Grill et al. |
| 6,660,822 B2 | 12/2003 | Lyu et al. |
| 6,713,643 B2 | 3/2004 | Pinnavaia et al. |
| 6,737,727 B2 | 5/2004 | Gates et al. |
| 6,737,809 B2 * | 5/2004 | Espiau et al. .................... 315/39 |
| 6,768,200 B2 | 7/2004 | Grill et al. |
| 6,770,573 B2 | 8/2004 | Grill et al. |
| 6,846,515 B2 * | 1/2005 | Vrtis et al. ............... 427/255.29 |
| 7,057,002 B2 | 6/2006 | Lee et al. |
| 7,288,292 B2 | 10/2007 | Gates et al. |
| 7,384,471 B2 * | 6/2008 | Vrtis et al. ............... 106/287.14 |
| 7,390,537 B1 | 6/2008 | Wu et al. |
| 7,479,306 B2 * | 1/2009 | Edelstein et al. ............. 427/447 |
| 7,674,521 B2 * | 3/2010 | Gates et al. ................ 428/312.8 |
| 2001/0051446 A1 | 12/2001 | Inoue et al. |
| 2003/0181537 A1 * | 9/2003 | Kirchmeyer et al. ........... 521/50 |
| 2005/0014009 A1 | 1/2005 | Lee et al. |
| 2005/0113472 A1 | 5/2005 | Fillmore et al. |
| 2006/0012014 A1 * | 1/2006 | Chen et al. .................... 257/635 |
| 2006/0084282 A1 | 4/2006 | Dubois et al. |
| 2009/0081585 A1 * | 3/2009 | Allen et al. ................ 430/281.1 |

FOREIGN PATENT DOCUMENTS

| | | |
|---|---|---|
| CN | 1479804 A | 3/2004 |
| CN | 1522462 A | 8/2004 |

OTHER PUBLICATIONS

Rathore, Jitendra S., et al., "Ultra Low-k Films Derived from Hyperbranched Polycarbosilanes (HBPCS)". Advanced Functional Materials, 2008, 18, pp. 4022-4028.*

* cited by examiner ness), and increased resistance to water degradation of properties such as stress-corrosion cracking, Cu ingress, and other critical properties. The present invention includes methods to make the inventive material and relates to the use of said dielectric material as an intralevel or interlevel dielectric film, a dielectric cap or a hard mask/polish stop in back end of the line (BEOL) interconnect structures on ultra-large scale integrated (ULSI) circuits and related electronic structures. The present invention also relates to the use of the inventive dielectric material in an electronic device containing at least two conductors or an electronic sensing structure.

METHOD OF FABRICATING A SICOH DIELECTRIC MATERIAL WITH IMPROVED TOUGHNESS AND IMPROVED SI-C BONDING

RELATED APPLICATIONS

This application is a continuation of U.S. patent application Ser. No. 11/132,108, filed on May 18, 2005, now U.S. Pat. No. 7,479,306, which is a continuation-in-part application of U.S. Ser. No. 11/040,778, filed Jan. 21, 2005, now U.S. Pat. No. 7,892,648, which application is related to co-assigned U.S. Pat. Nos. 6,147,009, 6,312,793, 6,441,491, 6,437,443, 6,541,398, 6,479,110 B2, and 6,497,963, the contents of which are incorporated herein by reference. The present application is also related to co-pending and co-assigned U.S. patent application Ser. Nos. 10/174,749, filed Jun. 19, 2002, now U.S. Pat. No. 6,768,200, 10/340,000, filed Jan. 23, 2003, now U.S. Pat. Nos. 6,770,573 and 10/390,801, filed Mar. 18, 2003, now U.S. Pat. No. 7,288,292, the entire contents of each of the aforementioned U.S. Patent Applications are also incorporated herein by reference.

FIELD OF THE INVENTION

The present invention generally relates to a class of dielectric materials comprising Si, C, O and H atoms (SiCOH) that have a low dielectric constant (k), and methods for fabricating films of these materials and electronic devices containing such films. Such materials are also called C doped oxide (CDO) or organosilicate glass (OSG). The material of the present invention exhibits improved cohesive strength (or equivalently, improved fracture toughness or reduced brittleness), and increased resistance to water degradation of properties such as stress-corrosion cracking, Cu ingress, and other critical properties. The present invention includes methods to make the inventive material and relates to the use of said dielectric material as an intralevel or interlevel dielectric film, a dielectric cap or a hard mask/polish stop in back end of the line (BEOL) interconnect structures on ultra-large scale integrated (ULSI) circuits and related electronic structures. The present invention also relates to the use of the inventive dielectric material in an electronic device containing at least two conductors or an electronic sensing structure.

BACKGROUND OF THE INVENTION

The continuous shrinking in dimensions of electronic devices utilized in ULSI circuits in recent years has resulted in increasing the resistance of the BEOL metallization as well as increasing the capacitance of the intralayer and interlayer dielectric. This combined effect increases signal delays in ULSI electronic devices. In order to improve the switching performance of future ULSI circuits, low dielectric constant (k) insulators and particularly those with k significantly lower than silicon oxide are needed to reduce the capacitances.

Most of the fabrication steps of very-large-scale-integration ("VLSI") and ULSI chips are carried out by plasma enhanced chemical or physical vapor deposition techniques. The ability to fabricate a low k material by a plasma enhanced chemical vapor deposition (PECVD) technique using previously installed and available processing equipment will thus simplify its integration in the manufacturing process, reduce manufacturing cost, and create less hazardous waste. U.S. Pat. Nos. 6,147,009 and 6,497,963 assigned to the common assignee of the present invention, which are incorporated herein by reference in their entirety, describe a low dielectric constant material consisting of elements of Si, C, O and H atoms having a dielectric constant not more than 3.6 and which exhibits very low crack propagation velocities.

U.S. Pat. Nos. 6,312,793, 6,441,491 and 6,479,110 B2, assigned to the common assignee of the present invention and incorporated herein by reference in their entirety, describe a multiphase low k dielectric material that consists of a matrix composed of elements of Si, C, O and H atoms, a phase composed mainly of C and H and having a dielectric constant of not more than 3.2.

Ultra low k dielectric materials having a dielectric constant of less than 2.7 (and preferably less than 2.3) are also known in the art. Key problems with prior art ultra low k SiCOH films include, for example: (a) they are brittle (i.e., low cohesive strength, low elongation to break, low fracture toughness); (b) liquid water and water vapor reduce the cohesive strength of the material even further. A plot of the cohesive strength, CS vs. pressure of water, $P_{H2O}$ or % humidity, which is referred as a "CS humidity plot", has a characteristic slope for each k value and material; (c) they tend to possess a tensile stress in combination with low fracture toughness, and hence can tend to crack when in contact with water when the film is above some critical thickness; (d) they can absorb water and other process chemicals when porous, which in turn can lead to enhanced Cu electrochemical corrosion under electric fields, and ingress into the porous dielectric leading to electrical leakage and high conductivity between conductors; and (e) when C is bound as Si—$CH_3$ groups, prior art SiCOH dielectrics readily react with resist strip plasmas, CMP processes, and other integration processes, causing the SiCOH dielectric to be "damaged" resulting in a more hydrophilic surface layer.

For example, the silicate and organosilicate glasses tend to fall on a universal curve of cohesive strength vs. dielectric constant as shown in FIG. 1. This figure includes conventional oxides (point A), conventional SiCOR dielectrics (point B), conventional k=2.6 SiCOH dielectrics (point C), and conventional CVD ultra low k dielectrics with k about 2.2 (point P). The fact that both quantities are predominantly determined by the volume density of Si—O bonds explains the proportional variation between them. It also suggests that OSG materials with ultra low dielectric constants (e.g., k<2.4) are fundamentally limited to having cohesive strengths about 3 $J/m^2$ or less in a totally dry environment. Cohesive strength is further reduced as the humidity increases.

Another problem with prior art SiCOH films is that their strength tends to be degraded by $H_2O$. The effects of $H_2O$ degradation on prior art SiCOH films can be measured using a 4-point bend technique as described, for example, in M. W. Lane, X. H. Liu, T. M. Shaw, "Environmental Effects on Cracking and Delamination of Dielectric Films", IEEE Transactions on Device and Materials Reliability, 4, 2004, pp. 142-147, FIG. 2A is taken from this reference, and is a plot illustrating the effects that $H_2O$ has on the strength of a typical SiCOH film having a dielectric constant, k of about 2.9. The data are measured by the 4-point bend technique in a chamber in which the pressure of water ($P_{H2O}$) is controlled and changed. Specifically, FIG. 2A shows the cohesive strength plotted vs. natural log(ln) of the $H_2O$ pressure in the controlled chamber. The slope of this plot is approximately −1 in the units used. Increasing the pressure of $H_2O$ decreases the cohesive strength. The region above the line in FIG. 2A, which is shaded, represents an area of cohesive strength that is difficult to achieve with prior art SiCOH dielectrics.

FIG. 2B is also taken from the M. W. Lane reference cited above, and is similar to FIG. 2A. Specifically, FIG. 2B is a plot of the cohesive strength of another SiCOH film measured using the same procedure as FIG. 2A. The prior art SiCOH film has a dielectric constant of 2.6 and the slope of this plot is about −0.66 in the units used. The region above the line in FIG. 2B, which is shaded, represents an area of cohesive strength that is difficult to achieve with prior art SiCOH dielectrics.

It is known that Si—C bonds are less polar than Si—O bonds. Further, it is known that organic polymer dielectrics have a fracture toughness higher than organosilicate glasses and are not prone to stress corrosion cracking (as are the Si—O based dielectrics). This suggests that the addition of more organic polymer content and more Si—C bonds to SiCOH dielectrics can decrease the effects of water degradation described above and increase the nonlinear energy dissipation mechanisms such as plasticity. Addition of more organic polymer content to SiCOH will lead to a dielectric with increased fracture toughness and decreased environmental sensitivity.

It is known in other fields that mechanical properties of some materials, for example, organic elastomers, can be improved by certain crosslinking reactions involving added chemical species to induce and form crosslinked chemical bonds. This can increase the elastic modulus, glass transition temperature, and cohesive strength of the material, as well as, in some cases, the resistance to oxidation, resistance to water uptake, and related degradations. These crosslinked bonds can be folded, such that under tensile stress they can support some amount of elongation of the molecular backbone without breaking, effectively increasing the fracture toughness of the material. One most famous example is the "vulcanization" of natural and synthetic rubber by the addition of sulfur or peroxide and curing, as invented by Charles Goodyear and independently by Thomas Hancock. When sulfur or peroxide are added to gum rubber, often with an aniline or other accelerator agent, and then the material is cured under heat and pressure, the sulfur forms folded or slanted polymer crosslinks between the polymer strands, binding them together elastically. The result is a greatly strengthened material with increased cohesive strength, and high resistance to moisture and other chemistries. Vulcanization has essentially enabled the ubiquitous use of rubber in many worldwide applications and industries.

In view of the above drawbacks with prior art low and ultra low k SiCOH dielectrics, there exists a need for developing a class of SiCOH dielectrics, both porous and dense, having a dielectric constant value of about 3.2 or less with a significantly increased cohesive strength vs. k curve that lies above the universal curve defined in FIG. 1. For the particular case in FIG. 1, the fracture toughness and the cohesive strength are equivalent. There further exists a need for developing a class of SiCOH dielectrics, both porous and dense, with specific forms of C bonding, possibly including Si—S, S—S and S—CH bonding, with greater organic character, increased resistance to water, particularly within the shaded regions of FIGS. 2A and 2B, and favorable mechanical properties that allow for such films to be used in new applications in ULSI devices.

SUMMARY OF THE INVENTION

One object of the present invention is to provide a low or ultra low k dielectric constant material comprising atoms of Si, C, O and H (hereinafter "SiCOH") having a dielectric constant of not more than 3.2, and having increased cohesive strength of not less than about 6 J/m$^2$, and preferably not less than about 7 J/m$^2$, as measured by channel cracking or a sandwiched 4 point bend fracture mechanics test.

It is yet another object of the present invention to provide a SiCOH dielectric having a covalently bonded tri-dimensional network structure, which includes C bonded as Si—CH$_3$ and also C bonded as Si—R—Si, wherein R is phenyl (i.e., —C$_6$H$_4$—), —[CH$_2$]$_n$— where n is greater than or equal to 1, HC=CH (i.e., a double bond), C=CH$_2$, C≡C (i.e., a triple bond), or a [S]$_n$ linkage, where n is as defined above. In one preferred embodiment, the SiCOH dielectric includes Si—[CH$_2$]$_n$—Si wherein n is 1 or 3.

It is yet another object of the present invention to provide a SiCOH dielectric material in which the fraction of C atoms bonded as Si—CH$_2$—Si (as detected by solid state NMR and by FTIR) is larger than in prior art SiCOH dielectrics.

It is another object of the present invention to provide a SiCOH dielectric material having a dielectric constant of not more than 3.2, which has a plot of CS vs. % humidity that shows a weak dependence on humidity. That is, at a given dielectric constant, the SiCOH dielectric materials of this invention have a smaller slope than the plots shown in FIGS. 2A and 2B, and the cohesive strength at a specific value of P$_{H2O}$ therefore lies above the line in FIG. 2A or 2B, in the shaded regions. By "weak dependence" it is meant that the inventive SiCOH dielectrics have a lower slope in the plot than prior art materials. Within the invention, this is achieved by decreasing the number of reactive sites (Si—O—Si). The slope of the CS vs ln P$_{H2O}$ curves is determined by the density of reactive Si—O—Si sites. While decreasing the number of Si—O—Si sites decreases the sensitivity to moisture, it also decreases the cohesive strength which depends linearly on the Si—O—Si bond density. However, the dielectric material of this invention overcomes this initial drop in cohesive strength (due to decreased Si—O—Si bond density), by incorporating Si—C type bonding, as described above, which may or may not exhibit nonlinear deformation behavior that further increases the mechanical strength of the material. The net result is a dielectric with cohesive strength in a dry ambient that is at least equal, but preferably, greater than an Si—O based dielectric with the same dielectric constant, and the inventive dielectric material has significantly reduced environmental sensitivity.

It is another object of the present invention to provide a SiCOH dielectric material having a dielectric constant of not more than 3.2, which is very stable towards H$_2$O vapor (humidity) exposure, including a resistance to crack formation in water.

It is still another object of the present invention to provide an electronic structure incorporating the inventive SiCOH material as an intralevel and or interlevel dielectric in a BEOL wiring structure.

It is another object of the present invention to provide PECVD methods for depositing and appropriate methods for curing the inventive SiCOH dielectric material.

It is another object of the present invention to provide further electronic structures (such as circuit boards or passive analogue devices) in which the inventive SiCOH dielectric material is used.

In broad terms, the present invention provides a dielectric material comprised of Si, C, O, and H in which a fraction of the C atoms are bonded as Si—CH$_3$ functional groups, and another fraction of the C atoms are bonded as Si—R—Si, wherein R is phenyl (i.e., C$_6$H$_4$), —[CH$_2$]$_n$— where n is greater than or equal to 1, HC=CH (i.e., a double bond), C=CH$_2$, C≡C (i.e., a triple bond) or a [S]$_n$ linkage, where n is a defined above. In accordance with the present invention, the fraction of the total carbon atoms in the material that is bonded as Si—R—Si is typically between 0.01 and 0.99, as determined by solid state NMR. In one preferred embodiment, the SiCOH dielectric includes Si—[CH$_2$]$_n$—Si wherein n is 1 or 3.

In a first embodiment of the present invention, a stable ultra low k SiCOH dielectric material is provided that has a dielectric constant of 3.0, a tensile stress of 30 MPa or less, an elastic modulus greater than 15 GPa, a cohesive strength significantly greater than 6 J/m$^2$, such as from about 6 to about 12 J/m$^2$, a crack development velocity in water of not more than 1×10$^{-10}$ m/sec for a film thickness of 3 microns, and a fraction of the C atoms are bonded in the functional group Si—CH$_2$—Si, wherein said methylene, CH$_2$ carbon fraction is from about 0.05 to about 0.5, as measured by C solid state NMR.

In a second embodiment of the present invention, a stable ultra low k SiCOH dielectric material is provided that has a dielectric constant of less than about 2.5, a tensile stress less than about 40 MPa, an elastic modulus greater than about 5 GPa, a cohesive strength greater than about 3 to about 6 J/m$^2$, a crack development velocity in water of not more than 1×10$^{-10}$ m/sec for a film thickness of 3 microns, and a fraction of the C atoms are bonded in the functional group Si—CH$_2$—Si wherein the carbon fraction is from about to 0.05 to about 0.5, as measured by C solid state NMR.

In alternative embodiments of the present invention, there is carbon bonded as Si—CH$_3$ and also carbon bonded as Si—R—Si, where R can be different organic groups.

In all embodiments of the inventive material, improved C—Si bonding is a feature of the materials compared to the Si—CH$_3$ bonding characteristic of prior art SiCOH and pSiCOH dielectrics.

In alternative embodiments of the present invention, there may be C—S, Si—S, and optionally S—S bonding.

In addition to the aforementioned properties, the inventive dielectric materials of the present invention are hydrophobic with a water contact angle of greater than 70°, more preferably greater than 80°, and exhibit a cohesive strength in shaded regions of FIGS. 2A and 2B. The equation for the line shown in FIG. 2A is γ(J/m$^2$)=−1.094 J/m$^2$*x+10.97 J/m$^2$ where X is ln of P$_{H2O}$ with P being in Pa. The equation for the line shown in FIG. 2B is γ (J/m$^2$)=−0.662 J/m$^2$*X+6.759 J/m$^2$ where X is ln of P$_{H2O}$ with P being in Pa.

The present invention also relates to electronic structures, in which the SiCOH dielectric material of the present invention may be used as the interlevel or intralevel dielectric, a capping layer, and/or as a hard mask/polish-stop layer in electronic structures.

Specifically, the electronic structures of the present invention includes a pre-processed semiconducting substrate that has a first region of metal embedded in a first layer of insulating material, a first region of conductor embedded in a second layer of insulating material, the second layer of insulating material being in intimate contact with the first layer of insulating material, the first region of conductor being in electrical communication with the first region of metal, and a second region of conductor being in electrical communication with the first region of conductor and being embedded in a third layer of insulating material, the third layer of insulating material being in intimate contact with the second layer of insulating material.

In the above structure, each of the insulating layers can comprise the inventive low or ultra low k SiCOH dielectric material with improved C bonding of the present invention.

The electronic structure may further include a dielectric cap layer situated in-between the first layer of insulating material and the second layer of insulating material, and may further include a dielectric cap layer situated in-between the second layer of insulating material and the third layer of insulating material. The electronic structure may further include a first dielectric cap layer between the second layer of insulating material and the third layer of insulating material, and a second dielectric cap layer on top of the third layer of insulating material.

In some embodiments, the dielectric cap itself can comprise the inventive low or ultra low k SiCOH dielectric material.

The electronic structure may further include a diffusion barrier layer of a dielectric material deposited on at least one of the second and third layer of insulating material. The electronic structure may further include a dielectric layer on top of the second layer of insulating material for use as a RIE hard mask/polish-stop layer and a dielectric diffusion barrier layer on top of the dielectric RIE hard mask/polish-stop layer. The electronic structure may further include a first dielectric RIE hard mask/polish-stop layer on top of the second layer of insulating material a first dielectric RIE diffusion barrier layer on top of the first dielectric polish-stop layer a second dielectric RIE hard mask/polish-stop layer on top of the third layer of insulating material, and a second dielectric diffusion barrier layer on top of the second dielectric polish-stop layer. The dielectric RIE hard mask/polish-stop layer may be comprised of the inventive SiCOH dielectric material as well.

The present invention also relates to various methods of fabricating the inventive SiCOH material.

The present invention also relates to the use of the inventive SiCOH dielectric film in other electronic structures including a structure including at least two conductors and an optoelectronic sensing structure, for use in detection of light.

DETAILED DESCRIPTION OF THE INVENTION

As stated above, the present invention provides dielectric materials (porous or dense, i.e., non-porous) that comprise a matrix of a hydrogenated oxidized silicon carbon material (SiCOH) comprising elements of Si, C, O and H in a covalently bonded tri-dimensional network and have a dielectric constant of about 3.2 or less. The term "tri-dimensional network" is used throughout the present application to denote a SiCOH dielectric material which includes silicon, carbon, oxygen and hydrogen that are interconnected and interrelated in the x, y, and z directions.

The present invention provides SiCOH dielectrics that have a covalently bonded tri-dimensional network structure which includes C bonded as Si—$CH_3$ and also C bonded as Si—R—Si, wherein R is phenyl (i.e., $C_6H_4$), —$[CH_2]_n$— where n is greater than or equal to 1, HC═CH (i.e., a double bond), C═$CH_2$, C≡C (i.e., a triple bond) or a $[S]_n$ linkage, where n is a defined above. In some embodiments of the present invention, the inventive dielectric material has a fraction of the total carbon atoms that is bonded as Si—R—Si between 0.01 and 0.99, as determined by solid state NMR. In one preferred embodiment, the SiCOH dielectric includes Si—$[CH_2]_n$—Si wherein n is 1 or 3. In the preferred embodiment, the total fraction of carbon atoms ion the material that is bonded as Si—$CH_2$—Si is between 0.05 and 0.5, as measured by solid state NMR.

The SiCOH dielectric material of the present invention comprises between about 5 and about 40, more preferably from about 10 to about 20, atomic percent of Si; between about 5 and about 50, more preferably from about 15 to about 40, atomic percent of C; between 0 and about 50, more preferably from about 10 to about 30, atomic percent of 0; and between about 10 and about 55, more preferably from about 20 to about 45, atomic percent of H.

In some embodiments, the SiCOH dielectric material of the present invention may further comprise F and/or N. In yet another embodiment of the present invention, the SiCOH dielectric material may optionally have the Si atoms partially substituted by Ge atoms. The amount of these optional elements that may be present in the inventive dielectric material of the present invention is dependent on the amount of precursor that contains the optional elements that is used during deposition.

The SiCOH dielectric material of the present invention optionally contains molecular scale voids (i.e., nanometer-sized pores) between about 0.3 to about 10 nanometers in diameter, and most preferably between about 0.4 and about 5 nanometers in diameter, which further reduce the dielectric constant of the SiCOH dielectric material. The nanometer-sized pores occupy a volume between about 0.5% and about 50% of a volume of the material. When these voids are present, the material is known as porous SiCOH or "pSiCOH".

Figure 1:
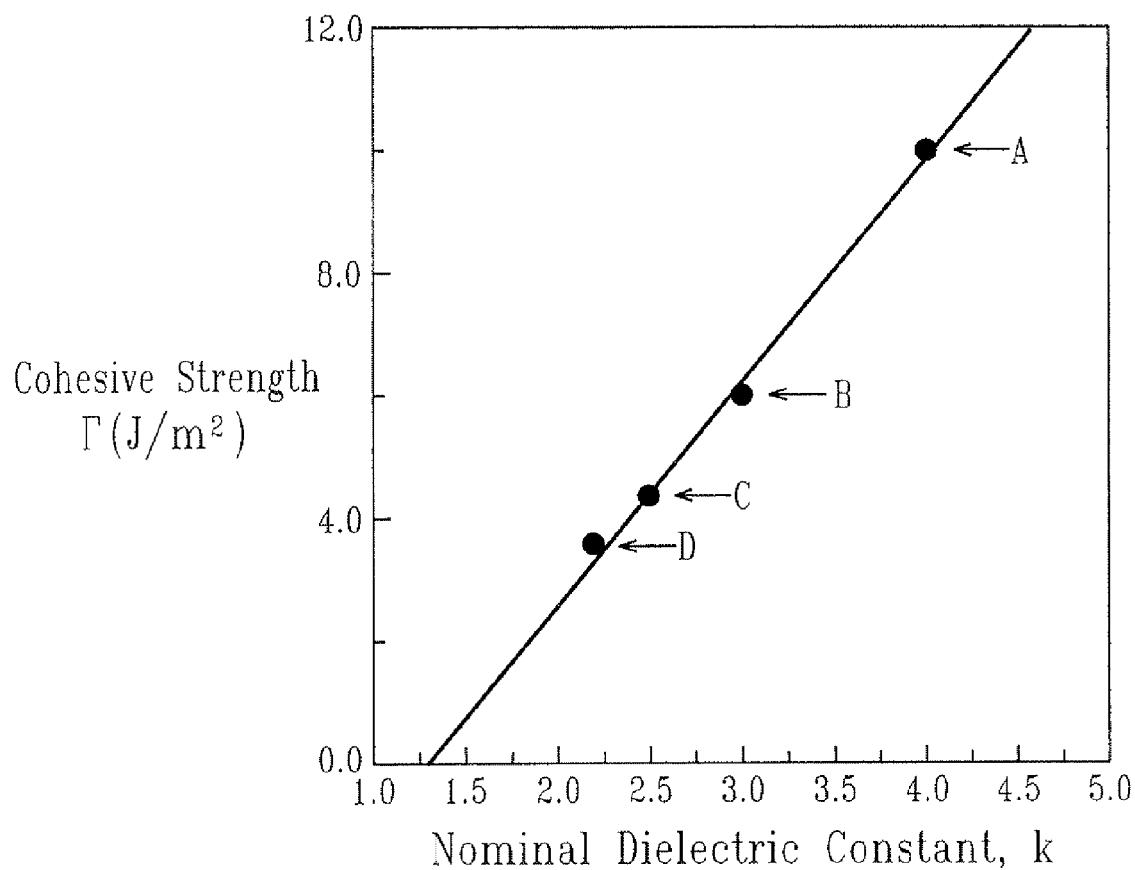
FIG. 1 is a universal curve of cohesive strength vs. dielectric constant showing prior art dielectrics.
Figure 3:
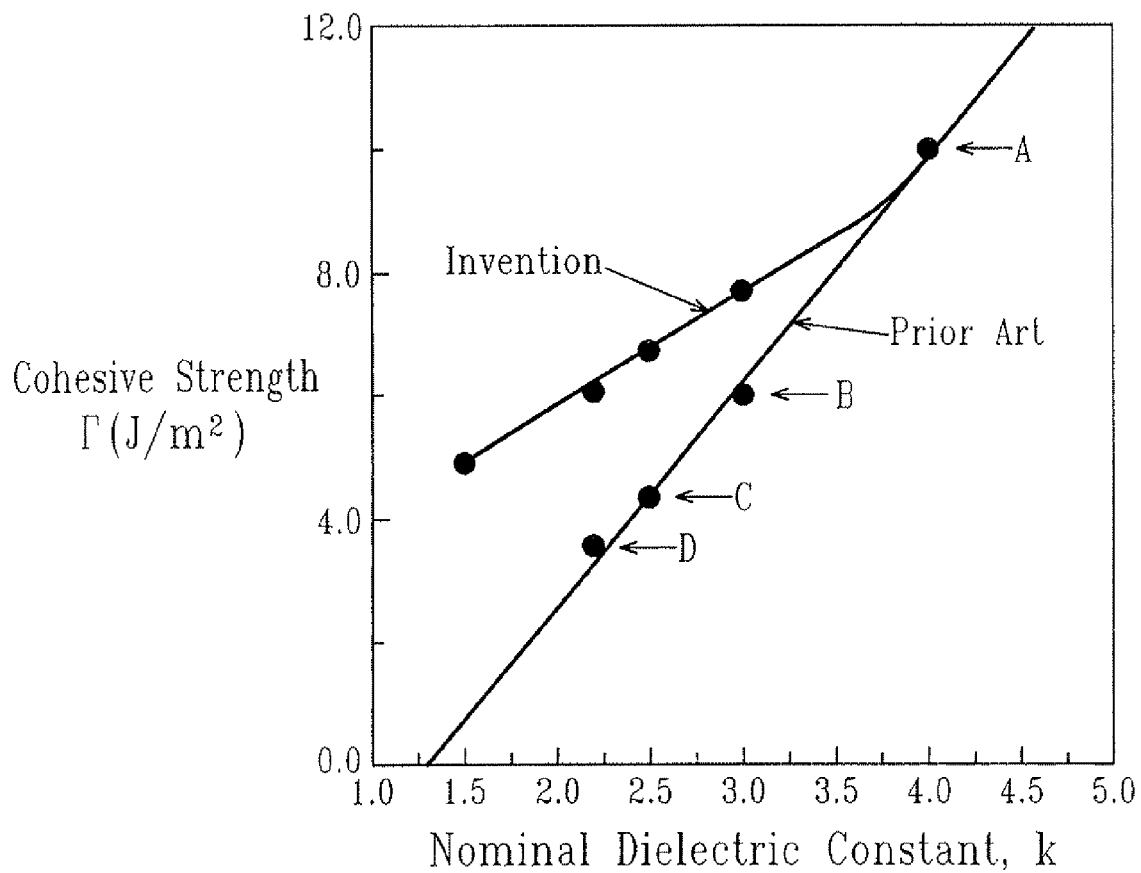
FIG. 3 is a universal curve of cohesive strength vs. dielectric constant including prior art dielectrics as shown in FIG. 1 as well as the inventive SiCOH dielectric material.

FIG. 3 shows a universal curve of cohesive strength vs. dielectric constant including prior art dielectrics as shown in FIG. 1 as well as the inventive SiCOH dielectric material. The plot in FIG. 3 shows that the inventive SiCOH dielectric has a higher cohesive strength than prior art dielectrics at equivalent values of k. In FIGS. 1 and 3, the k is reported as the relative dielectric constant.

In a first embodiment of the present invention, a stable ultra low k SiCOH dielectric material is provided that has a dielectric constant of 3.0, a tensile stress of 30 MPa or less, an elastic modulus greater than 15 GPa, cohesive strength greater than about 6 $J/m^2$, a crack development velocity in water of not more than $1\times10^{-10}$ m/sec for a film thickness of 3 microns, and a fraction of the C atoms are bonded in the functional group Si—$CH_2$—Si, wherein said methylene, $CH_2$ carbon fraction is about 0.1 is provided. Within the invention and as stated above, this fraction may be between about 0.05 to about 0.5, as measured by C solid state NMR.

In a second embodiment of the present invention, a stable ultra low k SiCOH dielectric material is provided that has a dielectric constant of less than 2.5, a tensile stress of from about 30 to about 40 MPa or less, an elastic modulus greater than 5 GPa, a cohesive strength greater than about 4 $J/m^2$, a crack development velocity in water of not more than $1\times10^{-10}$ nm/sec for a film thickness of 3 microns, and a fraction of the C atoms are bonded in the functional group Si—$CH_2$—Si wherein the methylene carbon fraction is from about 0.05 to about 0.5, as measured by C solid state NMR.

In some embodiments of the present invention, there is carbon bonded as Si—$CH_3$ and also carbon bonded as Si—R—Si, where R can be different organic groups 4.

In some embodiments of the present invention, the inventive dielectric material is characterized has (i) being dense or porous and having a cohesive strength in a dry ambient, i.e., the complete absence of water, greater than about 3 $J/m^2$ and a dielectric constant less than about 2.5, (ii) being dense or porous and having a cohesive strength greater than about 3 $J/m^2$ at a water pressure of 1570 Pa at 25° C. and a dielectric constant less than about 3.2 (50% relative humidity), or (iii) being dense or porous and having a cohesive strength greater than about 2.1 $J/m^2$ at a water pressure of 1570 Pa at 25° C. and a dielectric constant less than about 2.5.

The inventive SiCOH dielectric of the present invention has more carbon bonded in organic groups bridging between two Si atoms compared to the Si—$CH_3$ bonding characteristic of prior art SiCOH and pSiCOH dielectrics.

In some other embodiments of the present invention, there may be C—S, Si—S, and optionally S—S bonding in the inventive SiCOH dielectric.

Figure 2A:
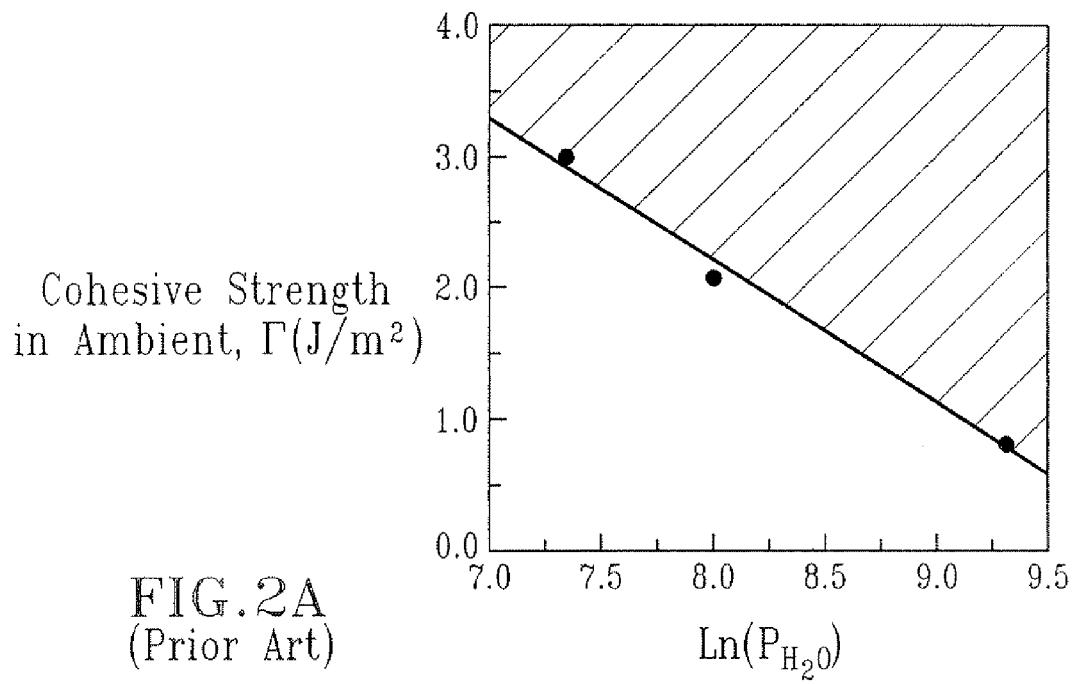
FIGS. 2A-2B show the cohesive strength plotted vs. natural log(ln) of the H$_2$O pressure in a controlled chamber for prior art SiCOH dielectrics.
Figure 2B:
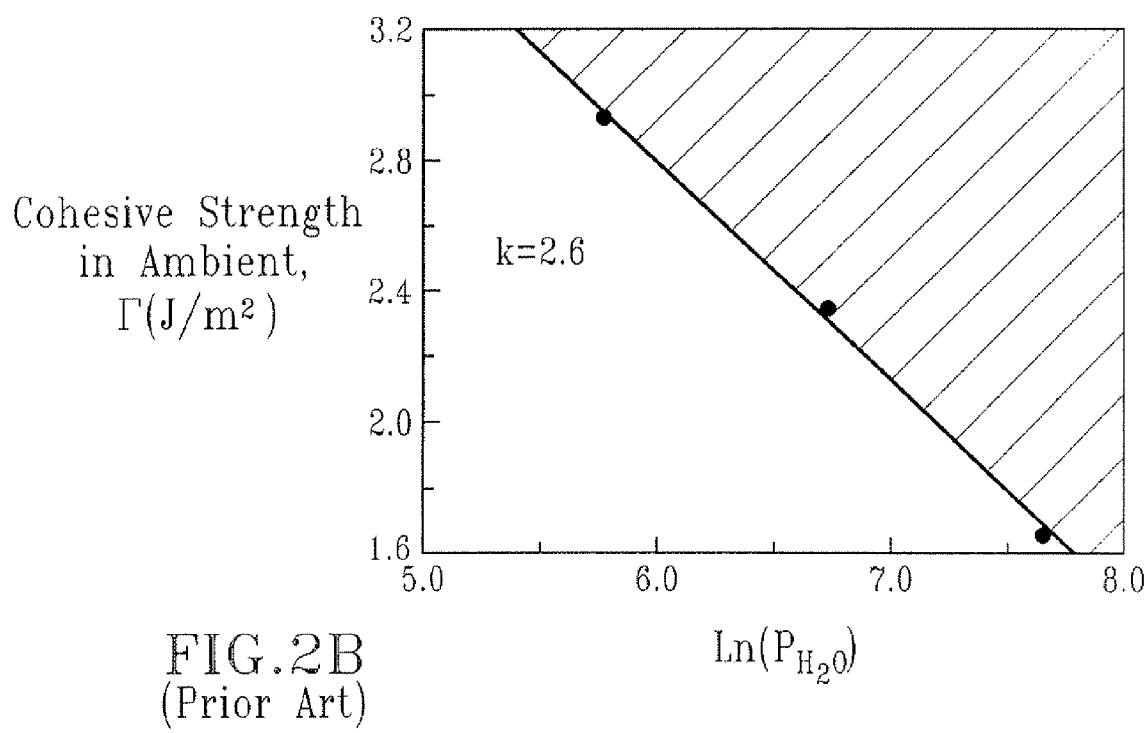

In addition to the aforementioned properties, the SiCOH dielectric materials of the present invention are hydrophobic with a water contact angle of greater than 70°, more preferably greater than 80° and exhibit a cohesive strength in shaded regions of FIGS. 2A and 2B.

The inventive SiCOH dielectric materials are typically deposited using plasma enhanced chemical vapor deposition (PECVD). In addition to PECVD, the present invention also contemplates that the SiCOH dielectric materials can be formed utilizing chemical vapor deposition (CVD), high-density plasma (HDP), pulsed PECVD, spin-on application, or other related methods.

In the deposition process, the inventive SiCOH dielectric material is formed by providing at least a first carbosilane or alkoxycarbosilane precursor (liquid, gas or vapor) comprising atoms of Si, C, O, and H, and an inert carrier such as He or Ar, into a reactor, preferably the reactor is a PECVD reactor, and then depositing a film derived from said first precursor onto a suitable substrate utilizing conditions that are effective in forming the SiCOH dielectric material of the present invention. The present invention yet further provides for optionally an oxidizing agent such as $O_2$, $N_2O$, $CO_2$ or a combination thereof to the gas mixture, thereby stabilizing the reactants in the reactor and improving the properties and uniformity of the dielectric film deposited on the substrate. The first precursor may include sulfur or S derivatives thereof as well.

Within the present invention, the first precursor comprises at least one of the following compounds: 1,3-disilacyclobutane, 1,3-disilapropane, 1,5-disilapentane, 1,4-bis-trihydrosilyl benzene, or the methoxy and ethoxy substituted derivatives of these compounds. Other examples of first precursors that can be used in the present invention are cyclic precursors including, but not limited to: octamethyl-1,5-disiloxane-3,7-disilacyclooctane, 1,3,5,7-tetramethyl-1,5-disiloxane-3,7-disilacyclooctane, 1,3,5,7-tetramethyl-1,3,5,7-tetrasilacyclooctane, 1,3,5-trimethyl-1,3,5-trisilacyclohexane, 1,3,5-trimethyl-1,3-disiloxane-5-silacyclohexane, and 1,3,5-trimethyl-1-siloxane-3,5-disilacyclohexane. Additionally, the present invention contemplates related derivatives of disilacyclooctane, tetrasilacyclooctane, disilacyclohexane, silacyclohexane, and similar cyclic carbosilane precursors.

The structures of the preferred cyclic compounds specifically mentioned herein above are shown to illustrate the types of cyclic compounds contemplated by the present invention (the illustrated structures thus do not limit the present invention in any way):

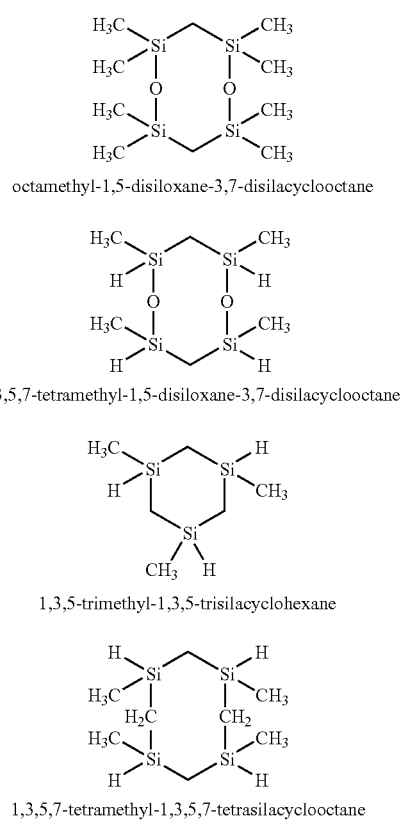

octamethyl-1,5-disiloxane-3,7-disilacyclooctane (i)

1,3,5,7-tetramethyl-1,5-disiloxane-3,7-disilacyclooctane (ii)

1,3,5-trimethyl-1,3,5-trisilacyclohexane (iii)

1,3,5,7-tetramethyl-1,3,5,7-tetrasilacyclooctane (iv)

1,3,5-trimethyl-1,3-disiloxane-5-silacyclohexane (v)

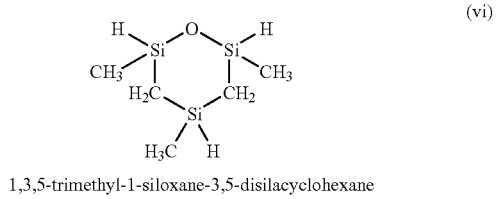

1,3,5-trimethyl-1-siloxane-3,5-disilacyclohexane (vi)

The cyclic compounds mentioned above are preferred in the present invention because these precursors have a relatively low boiling point, they are similar to precursors proven to work in manufacturing scale PECVD processes, and they include a combination in one molecule of the Si—CH$_2$—Si bonding group with at least one Si—O bond in the molecule.

Illustrative examples of some other preferred compounds used in forming the inventive SiCOH dielectric include: 1,1,3,3,-tetrahydrido-1,3-disilacyclobutane; 1,1,3,3-tetramethoxy(ethoxy)-1,3 disilacyclobutane; 1,3-dimethyl-1,3-dimethoxy-1,3 disilacyclobutane; 1,3-disilacyclobutane; 1,3-dimethyl-1,3-dihydrido-1,3-disilylcyclobutane; 1,1,3,3,-tetramethyl-1,3-disilacyclobutane; 1,1,3,3,5,5-hexamethoxy-1,3,5-trisilane; 1,1,3,3,5,5-hexahydrido-1,3,5-trisilane; 1,1,3,3,5,5-hexamethyl-1,3,5-trisilane; 1,1,1,3,3,3-hexamethoxy(ethoxy)-1,3-disilapropane; 1,1,3,3-tetramethoxy-1-methyl-1,3-disilabutane; 1,1,3,3-tetramethoxy-1,3-disilapropane; 1,1,1,3,3,3-hexahydrido-1,3-disilapropane; 3-(1,1-dimethoxy-1-silaethyl)-1,4,4-trimethoxy-1-methyl-1,4-disilpentane; methoxymethane 2-(dimethoxysilamethyl)-1,1,4-trimethoxy-1,4-disilabutane; methoxymethane 1,1,4-trimethoxy-1,4-disila-2-(trimethoxysilylmethyl)butane; dimethoxymethane, methoxymethane; 1,1,1,5,5,5-hexamethoxy-1,5-disilapentane; 1,1,5,5-tetramethoxy-1,5-disilahexane; 1,1,5,5-tetramethoxy-1,5-disilapentane; 1,1,1,4,4,4-hexamethoxy(ethoxy)-1,4-disilylbutane, 1,1,1,4,4,4,-hexahydrido-1,4-disilabutane; 1,1,4,4-tetramethoxy(ethoxy)-1,4-dimethyl-1,4-disilabutane; 1,4-bis-trimethoxy(ethoxy)silyl benzene; 1,4-bis-dimethoxymethylsilyl benzene; and 1,4-bis-trihydrosilyl benzene. Also the corresponding meta substituted isomers, such as, 1,1,1,4,4,4-hexamethoxy(ethoxy)-1,4-disilabut-2-ene; 1,1,1,4,4,4-hexamethoxy(ethoxy)-1,4-disilabut-2-yne; 1,1,3,3-tetramethoxy(ethoxy)-1,3-disilolane 1,3-disilolane; 1,1,3,3-tetramethyl-1,3-disilolane; 1,1,3,3-tetramethoxy(ethoxy)-1,3-disilane; 1,3-dimethoxy(ethoxy)-1,3-dimethyl-1,3-disilane; 1,3-disilane; 1,3-dimethoxy-1,3-disilane; 1-dimethoxy(ethoxy)-3,3-dimethyl-1-propyl-3-silabutane; or 2-silapropane.

In addition to the above mentioned materials, the present invention also contemplates sulfur derivatives thereof.

Scheme I below shows preferred first precursors that can be used in the present invention in forming the SiCOH dielectric material. Schemes IIA and IIB below are illustrations showing additional CVD carbosilane precursors that can be used in the present invention in forming the SiCOH dielectric material. The sulfur derivatives of the compounds shown in Schemes I, IIA and IIB are also contemplated herein.

Scheme I

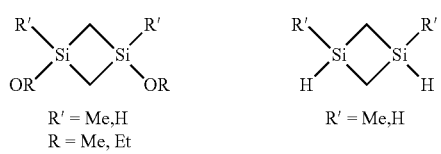

R' = Me, H
R = Me, Et

R' = Me, H

Scheme IIA

Scheme IIB

Optionally, a second SiCOH precursor may be added to the reactor, for example, diethoxymethylsilane, octamethyltetrasiloxane, tetramethyltetrasiloxane, trimethylsilane, or any other common alkylsilane or alkoxysilane (cyclic or linear) molecule.

Optionally, a precursor containing C—S—C or C—[S]$_n$—C or Si—S—Si, or Si—[S]$_n$—Si bonding may be added to the reactor.

In addition to the first precursor, a second precursor (gas, liquid or vapor) comprising atoms of C, X, and optionally O, F and/or N can be used. Optionally, a third precursor (gas, liquid or gas) comprising Ge may also be used.

The second or third precursor may be a hydrocarbon molecule, as described in U.S. Pat. Nos. 6,147,009, 6,312,793, 6,441,491, 6,437,443, 6,541,398, 6,479,110 B2, and 6,497,963, the contents of which are incorporated herein by reference.

The method of the present invention may further comprise the step of providing a parallel plate reactor, which has a conductive area of a substrate chuck between about 85 cm$^2$ and about 750 cm$^2$, and a gap between the substrate and a top electrode between about 1 cm and about 12 cm. A high frequency RF power is applied to one of the electrodes at a frequency between about 0.45 MHz and about 200 MHz. Optionally, an additional RF power of lower frequency than the first RF power can be applied to one of the electrodes.

The conditions used for the deposition step may vary depending on the desired final dielectric constant of the SiCOH dielectric material of the present invention. Broadly, the conditions used for providing a stable dielectric material comprising elements of Si, C, O, H that has a dielectric constant of about 3.2 or less, a tensile stress of less than 45 MPa, an elastic modulus from about 2 to about 15 GPa, and a hardness from about 0.2 to about 2 GPa include: setting the substrate temperature at between about 100° C. and about 425° C.; setting the high frequency RF power density at between about 0.1 W/cm$^2$ and about 2.0 W/cm$^2$; setting the first liquid precursor flow rate at between about 10 mg/min and about 5000 mg/min, optionally setting the second liquid precursor flow rate at between about 10 mg/min to about 5,000 mg/min; optionally setting the third liquid precursor flow rate at between about 10 mg/min to about 5000 mg/min; optionally setting the inert carrier gases such as Helium (or/ and Argon) flow rate at between about 10 sccm to about 5000 sccm; setting the reactor pressure at a pressure between about 1000 mTorr and about 10,000 mTorr; and setting the high frequency RF power between about 50 W and about 1000 W. Optionally, an ultra low frequency power may be added to the plasma between about 20 W and about 400 W. When the conductive area of the substrate chuck is changed by a factor of X, the RF power applied to the substrate chuck is also changed by a factor of X.

When an oxidizing agent is employed in the present invention, it is flowed into the PECVD reactor at a flow rate between about 10 sccm to about 1000 sccm.

While liquid precursors are used in the above example, it is known in the art that the organosilicon gas phase precursors (such as trimethylsilane) can also be used for the deposition.

The film resulting from the above processes is called herein the "as deposited film".

According to the present invention, the fabrication of the stable SiCOH dielectric materials of the present invention may require a combination of several steps:

the material is deposited on a substrate in a 1$^{st}$ step, using deposition tool parameters in a specific range of values given below in the process embodiments, forming the as deposited film;

the material is cured or treated using thermal, UV light, electron beam irradiation, chemical energy, or a combination of more than one of these, forming the final film having the desired mechanical and other properties described herein. For example, after deposition a treatment of the SiCOH film (using both thermal energy and a second energy source) may be performed to stabilize the film and obtain improved properties. The second energy source may be electromagnetic radiation (UV, microwaves, etc.), charged particles (electron or ion beam) or may be chemical (using atoms of hydrogen, or other reactive gas, formed in a plasma).

In a preferred treatment, the substrate (containing the film deposited according to the above process) is placed in a ultraviolet (UV) treatment tool, with a controlled environment (vacuum or ultra pure inert gas with a low O$_2$ and H$_2$O concentration). A pulsed or continuous UV source may be used.

Within the invention, the UV treatment tool may be connected to the deposition tool ("clustered"), or may be a separate tool.

As is known in the art, the two process steps will be conducted within the invention in two separate process chambers that may be clustered on a single process tool, or the two chambers may be in separate process tools ("declustered"). For porous SiCOH films, the cure step may involve removal of a sacrificial hydrocarbon (porogen) component, co-deposited with the dielectric material. Suitable sacrificial hydrocarbon components that can be employed in the present invention include, but are not limited to: the second precursors that are mentioned in U.S. Pat. Nos. 6,147,009, 6,312,793, 6,441, 491, 6,437,443, 6,541,398, 6,479,110 B2, and 6,497,963, the contents of which are incorporated herein by reference.

The following are examples illustrating material and processing embodiments of the present invention.

EXAMPLE 1

SiCOH Material A

In this example, an inventive SiCOH dielectric, referred to as SiCOH film A, which was made in accordance with the present invention, was characterized by the data in FIG. 4 and in Table 1 below. For comparison, SiCOH films B and C are "typical" prior art SiCOH films, that have a dielectric constant about 2.7-2.8 are also shown in FIG. 4 and Table 1.

Figure 4:
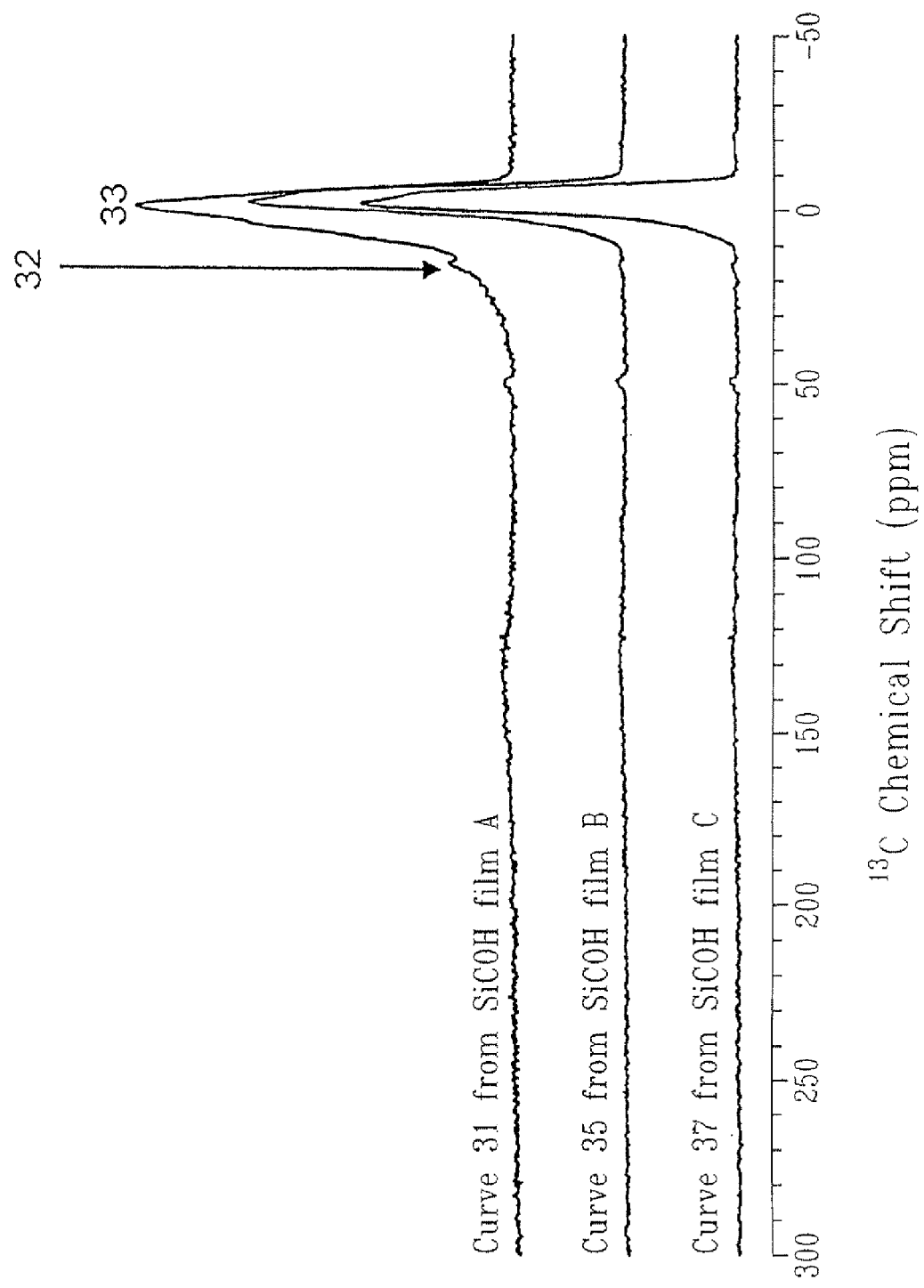
FIG. 4 is the solid state NMR (nuclear magnetic resonance) spectra for the $^{13}$C nuclei for the inventive SiCOH film A (Curve 31), for a prior art SiCOH film B (Curve 35), and for another prior art SiCOH film C (Curve 37).

Referring to FIG. 4, this figure shows solid-state NMR (nuclear magnetic resonance) spectra for the $^{13}$C nuclei for the film SiCOH film A. Peak 33 corresponds to $^{13}$C for CH$_3$ methyl groups bonded to Si, and the breadth of peak 33 is due to CH$_3$ groups in different magnetic environments. The peak 32 was assigned to $^{13}$C in —CH$_2$— species, bridging between two Si atoms, Si—CH$_2$—Si. Based on the height of peak 32, the fraction of the total C in the film that is C present as methylene bridge groups, —CH$_2$— was about 0.1. Since peaks 33 and 32 were overlapping, this was an estimate only. The areas have not been measured. Also, in FIG. 4 is curve 35 measured from SiCOH film B and curve 37 measured from SiCOH film C. It was seen that spectra 35 and 37 (NMR spectra) from other SiCOH films, which are "typical" prior art SiCOH films, contained peak 33 assigned to CH$_3$ groups. The spectra 35 and 37 do not contain peak 32.

Table 1 below summarizes the FTIR (Fourier transform infrared spectroscopy) spectra measured from SiCOH films A, B, and C. The numbers in the table are integrated areas under the FTIR peaks, and the last column is the ratio of two FTIR peak areas. The ratio (CH$_2$+CH$_3$)/SiCH$_3$ was calculated in order to show the enhanced contribution of $CH_2$ species to the FTIR peak area of $(CH_2+CH_3)$ in the inventive SiCOH film A. It was seen that this ratio was about 0.9 in the inventive SiCOH film A, and was about 0.6 in a typical SiCOH film such as SiCOH film B or C. Moreover, the SiCOH film A contained more $CH_2$ species than films B or C. From the NMR analysis, these were assigned to Si—$CH_2$—Si in the inventive SiCOH film A.

TABLE 1

| Film | Si—$CH_3$ Peak Area | $(CH_2 + CH_3)$ total FTIR Peak Area | Ratio of $(CH_2 + CH_3)$/ Si—$CH_3$ |
|---|---|---|---|
| SiCOH film A | 1.67 | 1.48 | 0.89 |
| SiCOH film B | 2.18 | 1.35 | 0.62 |
| SiCOH film C | 2.09 | 1.23 | 0.59 |

EXAMPLE 2

First Process Embodiment

A 300 mm or 200 mm substrate was placed in a PECVD reactor on a heated wafer chuck at 350° C. Temperatures between 300°-425° C. may also be used. Any PECVD deposition reactor may be used within the present invention. Gas and liquid precursor flows were then stabilized to reach a pressure in the range from 0.1-10 Torr, and RF radiation was applied to the reactor showerhead for a time between about 5 to about 500 seconds.

Specifically and for the growth of the inventive SiCOH dielectric material A containing enhanced Si—$CH_2$—Si bridging methylene carbon (described above), the single SiCOH precursor was OMCTS (octamethylcyclotetrasiloxane) set at a flow of 2500 mg/m, an oxygen, $O_2$ flow of 220 sccm, a helium, He gas flow of 2000 sccm, said flows were stabilized to reach a reactor pressure of 5 Torr. The wafer chuck was set at 350° C., and the high frequency RF power of 400 W at a frequency of 13.6 MHz was applied to the showerhead, and the low frequency RF power of 60 W at a frequency of 13.6 MHz was applied to the substrate. The film deposition rate was 2025 Angstrom/min.

EXAMPLE 3

Second Process Embodiment

A 300 mm or 200 mm substrate was placed in a PECVD reactor on a heated wafer chuck at 300°-425° C. and preferably at 350°-400° C. Any PECVD deposition reactor may be used within the present invention. Gas and liquid precursor flows were then stabilized to reach a pressure in the range from 0.1-10 Torr, and RF radiation was applied to the reactor showerhead for a time between about 5 to 500 seconds.

Specifically and for the growth of the inventive SiCOH dielectric containing enhanced Si—$CH_2$—Si bridging methylene carbon (described above), the conditions used include: 1,1,1,3,3,3-hexamethoxy-1,3-disilapropane, flow of 2500 mg/m, an oxygen, $O_2$ flow of 220 sccm, a helium, He gas flow of 2000 sccm, said flows were stabilized to reach a reactor pressure of 5 Torr. The wafer chuck was set at 350° C., and the high frequency RF power of 500 W at a frequency of 13.6 MHz was applied to the showerhead, and the low frequency RF power of 160 W at a frequency of 13.6 MHz was applied to the substrate. The film deposition rate was in the range between 10-100 Angstrom/second.

As is known in the art, each of the above process parameters may be adjusted within the scope of invention described above. For example, different RF frequencies including, but not limited to, 0.26, 0.35, 0.45 MHz, may also be used in the present invention. Also for example, the $O_2$ flow rate may be zero, and alternative oxidizers including $N_2O$, CO, or $CO_2$ may be used in place of $O_2$. Also, in the precursor 1,1,1,3,3,3-hexamethoxy-1,3-disilapropane, the methoxy substituent groups may be replaced by hydrido, methyl or ethoxy groups. Also, the precursor 1,3-disilabutane ($H_3Si$—$CH_2$—$Si(H_2)$—$CH_3$) may be used in an alternative embodiment, and the flow of $O_2$ and other gases would be adjusted, as is known in the art.

In still other embodiments, any of the carbosilane precursors shown in Schemes I, IIA and IIB may be used.

EXAMPLE 4

Third Process Embodiment

A 300 mm or 200 mm substrate was placed in a PECVD reactor on a heated wafer chuck at 300°-425° C. and preferably at 350°-400° C. Any PECVD deposition reactor may be used within the present invention. Gas and liquid precursor flows were then stabilized to reach a pressure in the range from 1-10 Torr, and RF radiation was applied to the reactor showerhead for a time between about 5 to 500 seconds.

For the growth of a SiCOH material with k greater than or equal to 10.8, and having enhanced Si—$CH_2$—Si bridging methylene carbon, two precursors were used, specifically 1,3-disilacyclobutane and DEMS (diethoxymethylsilane). Within the invention, any alkoxysilane precursor may be used in place of DEMS, including but not limited to: OMCTS, TMCTS, or dimethyldmethoxysilane. Also, within the invention, the alkoxysilane precursor (used in place of DEMS) may be an organosilicon precursor with a built-in porogen, and may optionally comprise one of vinylmethyldiethoxysilane, vinyltriethoxysilane, vinyldimethylethoxysilane, cyclohexenylethyltriethoxysilane, 1,1-diethoxy-1-silacyclopent-3-ene, divinyltetramethyldisiloxane, 2-(3,4-epoxycyclohexyl) ethyltriethoxysilane, 2-(3,4-epoxycyclohexyl) ethyltrimethoxysilane, epoxyhexyltriethoxysilane, hexavinyldisiloxane, trivinylmethoxysilane, trivinylethoxysilane, vinylmethylethoxysilane, vinylmethyldiethoxysilane, vinylmethyldimethoxysilane, vinylpentamethyldisiloxane, vinyltetramethyldisiloxane, vinyltriethoxysilane, or vinyltrimethoxysilane.

As is known in the art, gases such as $O_2$ may be added, and He may be replaced by gases such as Ar, $CO_2$, or another noble gas.

The conditions used include a DEMS flow of 2000 mg/m, a 1,3-disilacyclobutane flow of 100 to 1000 mg/m, and a He gas flow of 1000 sccm, said flows were stabilized to reach a reactor pressure of 6 Torr. The wafer chuck was set at 350° C., and the high frequency RF power of 470 W was applied to the showerhead, and the low frequency RF (LRF) power was 0 W so that no LRF was applied to the substrate. The film deposition rate was about 2,000-4,000 Angstrom/second.

As is known in the art, each of the above process parameters may be adjusted within the scope of invention described above. For example, different RF frequencies including, but not limited to, 0.26, 0.35, 0.45 MHz, may also be used in the present invention. Also for example, an oxidizer such as $O_2$, or alternative oxidizers including $N_2O$, CO, or $CO_2$ may be used. Specifically, the wafer chuck temperature may be lower, for example, to 150°-350° C.

While 1,3-disilacyclobutane is the preferred carbosilane to provide an enhanced fraction of Si—$CH_2$—Si bridging methylene carbon, other carbosilane or alkoxycarbosilane precursors described above can be used, including but not limited to the precursors shown in Schemes I, IIA and IIB.

In alternate embodiments, the conditions are adjusted to produce SiCOH films with dielectric constant from 1.8 up to 2.7.

In alternate embodiments, other functional groups may be added as bridging groups between Si and Si, using the selected carbosilane precursors, with illustrative examples given here. In order to add the $CH_2$—$CH_2$—$CH_2$— functional group bridging between Si atoms the selected carbosilane precursor may be selected from 1,3-disilolane, 1,1,3,3-tetramethoxy(ethoxy)-1,3-disilolane or 1,1,3,3-tetramethyl-1,3-disilolane.

In order to add the phenyl functional group bridging between Si atoms the selected carbosilane precursor may be selected 1,4-bis-trimethoxy(ethoxy)silyl benzene, 1,4-bis-dimethoxymethylsilyl benzene, 1,4-bis-trihydrosilyl benzene or related Si containing benzene derivatives.

In order to add the HC=CH functional group bridging between Si atoms, the selected carbosilane precursor may be selected from 1,1,1,4,4,4-hexamethoxy(ethoxy)-1,4-disilabut-2-ene or another Si containing ethylene derivative.

In order to add the C≡C (triple bond) functional group bridging between Si atoms, the selected carbosilane precursor may be 1,1,1,4,4,4-hexamethoxy-1,4-disilabut-2-yne, 1,1,1,4,4,4-hexaethoxy-1,4-disilabut-2-yne, or another Si containing acetylene derivative.

In the above examples, the precursors are described having methoxy and ethoxy substituent groups, but these may be replaced by hydrido or methyl groups, and a carbosilane molecule containing a mixture of methoxy, ethoxy, hydrido and methyl substituent groups may be used within the invention.

EXAMPLE 5

Fourth Process Embodiment

A 300 mm or 200 mm substrate was placed in a PECVD reactor on a heated wafer chuck at 300°-425° C. and preferably at 350°-400° C. Any PECVD deposition reactor may be used within the present invention. Gas and liquid precursor flows were then stabilized to reach a pressure in the range from 0.1-10 Torr, and RF radiation was applied to the reactor showerhead for a time between about 5 to 500 seconds.

For the growth of a SiCOH material with k greater than or equal to 1.8, and having enhanced Si—$CH_2$—Si bridging methylene carbon, a single alkoxycarbosilane precursor was used. The linear precursors shown in Scheme I are preferred.

The conditions used include a single precursor flow of 2000 mg/m, and a He gas flow of 1000 sccm, said flows were stabilized to reach a reactor pressure of 6 Torr. The wafer chuck was set at 350° C., and the high frequency RF power of 470 W was applied to the showerhead, and the low frequency RF (LRF) power was 0 W so that no LRF is applied to the substrate. The film deposition rate was about 1,000 to 5,000 Angstrom/second.

As is known in the art, each of the above process parameters may be adjusted within the invention. Specifically, the wafer chuck temperature may be lower, for example 150°-350° C. As is known in the art, gases such as $O_2$ may be added, and He may be replaced by gases such as Ar, $CO_2$, or another noble gas.

In alternate embodiments, the conditions are adjusted to produce SiCOH films with dielectric constant from 1.8 up to 2.7.

While linear precursors from Scheme I are the preferred alkoxycarbosilane to provide an enhanced fraction of Si—$CH_2$—Si bridging methylene carbon, any alkoxycarbosilane mentioned above in the detailed description of the present invention can be used. Other functional groups may be added using the selected carbosilane precursors, with illustrative examples given here. In order to add the —$CH_2$—$CH_2$—$CH_2$— functional group bridging between Si atoms, the selected carbosilane precursor may be selected from 1,3-disilolane, 1,1,3,3-tetramethoxy(ethoxy)-1,3-disilolane or 1,1,3,3-tetramethyl-1,3-disilolane.

In order to add the phenyl functional group bridging between Si atoms, the selected carbosilane precursor may be selected 1,4-bis-trimethoxy(ethoxy)silyl benzene, 1,4-bis-dimethoxymethylsilyl benzene, 1,4-bis-trihydrosilyl benzene or related Si containing benzene derivatives.

In order to add the HC=CH functional group bridging between Si atoms, the selected carbosilane precursor may be selected from 1,1,1,4,4,4-hexamethoxy(ethoxy)-1,4-disilabut-2-ene or another Si containing ethylene derivative.

In order to add the C≡C (triple bond) functional group bridging between Si atoms the selected carbosilane precursor may be 1,1,1,4,4,4-hexamethoxy-1,4-disilabut-2-yne, 1,1,1,4,4,4-hexaethoxy-1,4-disilabut-2-yne, or another Si containing acetylene derivative.

In the above examples, the precursors are described having methoxy and ethoxy substituent groups, but these may be replaced by hydrido or methyl groups, and a carbosilane molecule containing a mixture of methoxy, ethoxy, hydrido and methyl substituent groups may be used within the invention.

EXAMPLE 6

Fifth Process Embodiment

A 300 mm or 200 mm substrate was placed in a PECVD reactor on a heated wafer chuck at 300°-425° C. and preferably at 350°-400° C. Any PECVD deposition reactor may be used within the present invention. Gas and liquid precursor flows were then stabilized to reach a pressure in the range from 1-10 Torr, and RF radiation was applied to the reactor showerhead for a time between about 5 to 500 seconds.

In this example and for the growth of a porous SiCOH material with k greater than or equal to 1.8, and having enhanced Si—$CH_2$—Si bridging methylene carbon or other organic functions bridging between two Si atoms, a porogen is added according to methods known in the art. The porogen may be bicycloheptadiene (BCHD), or other molecules described, for example, in U.S. Pat. Nos. 6,147,009, 6,312,793, 6,441,491, 6,437,443, 6,541,398, 6,479,110 B2, and 6,497,963.

For the SiCOH precursor, the linear alkoxysilane precursors shown in Scheme I are preferred.

The conditions used include a precursor flow of 100-2000 mg/m, a He gas flow of 10-500 sccm, and a porogen flow of about 50-2000 mg/m, said flows were stabilized to reach a reactor pressure of 7 Torr. The wafer chuck was set at 225° C., and the high frequency RF power of 300 W was applied to the showerhead, and the low frequency RF (LRF) power was 0 W so that no LRF was applied to the substrate. The film deposition rate was about 1,000 to 5,000 Angstrom/second.

As is known in the art, each of the above process parameters may be adjusted within the invention. For example, the wafer chuck temperature may be between 150°-350° C.

While the preferred linear alkoxycarbosilanes of Scheme I are useful, any alkoxycarbosilane as mentioned above may be used within the invention. Also within the invention, two SiCOH precursors may be used, for example DEMS and a carbosilane or alkoxycarbosilane described above. As is known in the art, gases such as $O_2$, $N_2O$, or another oxidizer may be added, and He may be replaced by gases such as Ar, $CO_2$, or another noble gas. Again, other functional groups, as described in the above examples, can be used to form a bridging group between two Si atoms.

EXAMPLE 7

Sixth Process Embodiment

A 300 mm or 200 mm substrate was placed in a PECVD reactor on a heated wafer chuck at 300°-425° C. and preferably at 350°-400° C. Any PECVD deposition reactor may be used within the present invention. Gas and liquid precursor flows were then stabilized to reach a pressure in the range from 1-10 Torr, and RF radiation was applied to the reactor showerhead for a time between about 5 to 500 seconds.

Specifically, and for the growth of the inventive SiCOH dielectric containing enhanced Si—$CH_2$—Si bridging methylene carbon (described above), the conditions used include selecting the precursor octamethyl-1,5-disiloxane-3,7-disilacyclooctane, and setting flow of this precursor at 2500 mg/m, $O_2$ flow at 200 sccm, helium gas flow at 2000 sccm, wherein said flows were stabilized to reach a reactor pressure of 5 Torr. The wafer chuck was set at 350° C., and the high frequency RF power of 500 W at a frequency of 13.6 MHz was applied to the showerhead. The film deposition rate was in the range between 10-100 Å/second.

As is known in the art, each of the above process parameters may be adjusted within the scope of this invention. For example, different RF frequencies including, but not limited to, 0.26, 0.35, 0.45 MHz, may also be used in the present invention. Also for example, the $O_2$ flow rate may be zero, or may be in the range 1 to 500 sccm, and alternative oxidizers including $N_2O$, CO, or $CO_2$ may be used in place of $O_2$. Also, the flow rate of the carbosilane precursor may be in the range 100-5000 mg/m. Also, the RF power may be adjusted to improve the film, with a typical range being 100 to 1000 Watts and the pressure may be in the range 0.1 to 50 Torr.

In still other alternative embodiments, any of 3,5,7-tetramethyl-1,5-disiloxane-3,7-disilacyclooctane, 1,3,5,7-tetramethyl-1,3,5,7-tetrasilacyclooctane, 1,3,5-trimethyl-1,3,5-trisilacyclohexane, 1,3,5-trimethyl-1,3-disiloxane-5-silacyclohexane, 1,3,5-trimethyl-1-siloxane-3,5-disilacyclohexane as well as derivatives of disilacyclooctane, tetrasilacyclooctane, disilacyclohexane, silacyclohexane, and similar cyclic carbosilane precursors may also be used within the invention.

EXAMPLE 8

Seventh Process Embodiment

A 300 mm or 200 mm substrate was placed in a PECVD reactor on a heated wafer chuck at 300°-425° C. and preferably at 350°-400° C. Any PECVD deposition reactor may be used within the present invention. Gas and liquid precursor flows were then stabilized to reach a pressure in the range from 1-10 Torr, and RF radiation was applied to the reactor showerhead for a time between about 5 to 500 seconds.

Specifically, and for the growth of the inventive SiCOH dielectric containing enhanced Si—$CH_2$—Si bridging methylene carbon (described above), the conditions used include selecting the precursor octamethyl-1,5-disiloxane-3,7-disilacyclooctane and a porogen molecule, and setting flow of the cyclic precursor and the porogen within the range from 100 to 5000 mg/m. The porogen may be selected according to methods known in the art. The porogen may be any of the molecules described, for example, in U.S. Pat. Nos. 6,147,009, 6,312,793, 6,441,491, 6,437,443, 6,541,398, 6,479,110 B2, and 6,497,963.

The $O_2$ flow was set at 200 sccm, and the helium gas flow was set at 2000 sccm. In accordance with the present invention the flows were stabilized to reach a reactor pressure of 5 Torr. The wafer chuck was set at 350° C., and the high frequency RF power of 500 W at a frequency of 13.6 MHz was applied to the showerhead. The film deposition rate was in the range between 10-100 Å/second.

As is known in the art, each of the above process parameters may be adjusted within the scope of this invention. For example, different RF frequencies including, but not limited to, 0.26, 0.35, 0.45 MHz, may also be used in the present invention. Also for example, the $O_2$ flow rate may be zero, or may be in the range 1 to 500 sccm, and alternative oxidizers including $N_2O$, CO, or $CO_2$ may be used in place of $O_2$. Also, the flow rate of the carbosilane precursor may be in the range 100-5000 mg/m. Also, the RF power may be adjusted to improve the film, with a typical range being 100 to 1000 Watts and the pressure may be in the range 0.1 to 50 Torr.

In still other alternative embodiments, any of 3,5,7-tetramethyl-1,5-disiloxane-3,7-disilacyclooctane, 1,3,5,7-tetramethyl-1,3,5,7-tetrasilacyclooctane, 1,3,5-trimethyl-1,3,5-trisilacyclohexane, 1,3,5-trimethyl-1,3-disiloxane-5-silacyclohexane, 1,3,5-trimethyl-1-siloxane-3,5-disilacyclohexane as well as derivatives of disilacyclooctane, tetrasilacyclooctane, disilacyclohexane, silacyclohexane, and similar cyclic carbosilane precursors may also be used within the invention.

The electronic devices which can include the inventive SiCOH dielectric are shown in FIGS. 5-8. It should be noted that the devices shown in FIGS. 5-8 are merely illustrative examples of the present invention, while an infinite number of other devices may also be formed by the present invention novel methods.

Figure 5:
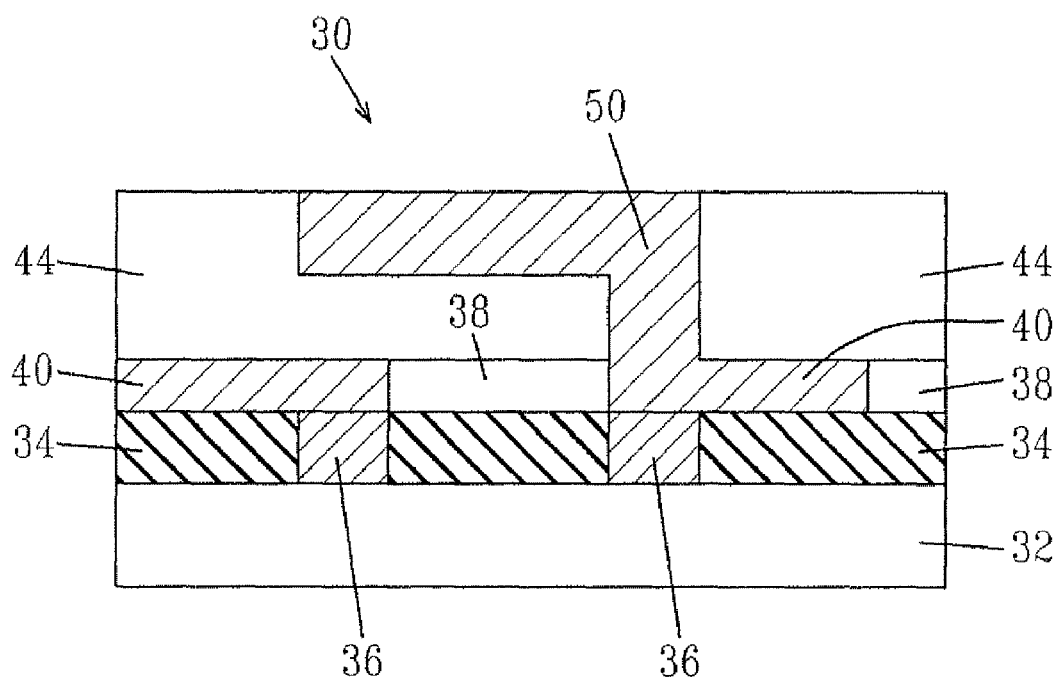
FIG. 5 is an enlarged, cross-sectional view of an electronic device of the present invention that includes the inventive SiCOH dielectric film as both the interlevel dielectric layer and the interlevel dielectric layer.

In FIG. 5, an electronic device 30 built on a silicon substrate 32 is shown. On top of the silicon substrate 32, an insulating material layer 34 is first formed with a first region of metal 36 embedded therein. After a CMP process is conducted on the first region of metal 36, a SiCOH dielectric film 38 of the present invention is deposited on top of the first layer of insulating material 34 and the first region of metal 36. The first layer of insulating material 34 may be suitably formed of silicon oxide, silicon nitride, doped varieties of these materials, or any other suitable insulating materials. The SiCOH dielectric film 38 is then patterned in a photolithography process followed by etching and a conductor layer 40 is deposited thereon. After a CMP process on the first conductor layer 40 is carried out, a second layer of the inventive SiCOH film 44 is deposited by a plasma enhanced chemical vapor deposition process overlying the first SiCOH dielectric film 38 and the first conductor layer 40. The conductor layer 40 may be deposited of a metallic material or a nonmetallic conductive material. For instance, a metallic material of aluminum or copper, or a nonmetallic material of nitride or polysilicon. The first conductor 40 is in electrical communication with the first region of metal 36.

A second region of conductor 50 is then formed after a photolithographic process on the SiCOH dielectric film 44 is conducted followed by etching and then a deposition process for the second conductor material. The second region of conductor 50 may also be deposited of either a metallic material or a nonmetallic material, similar to that used in depositing the first conductor layer 40. The second region of conductor 50 is in electrical communication with the first region of conductor 40 and is embedded in the second layer of the SiCOH dielectric film 44. The second layer of the SiCOH dielectric film is in intimate contact with the first layer of SiCOH dielectric material 38. In this example, the first layer of the SiCOH dielectric film 38 is an intralevel dielectric material, while the second layer of the SiCOH dielectric film 44 is both an intralevel and an interlevel dielectric. Based on the low dielectric constant of the inventive SiCOH dielectric films, superior insulating property can be achieved by the first insulating layer 38 and the second insulating layer 44.

Figure 6:
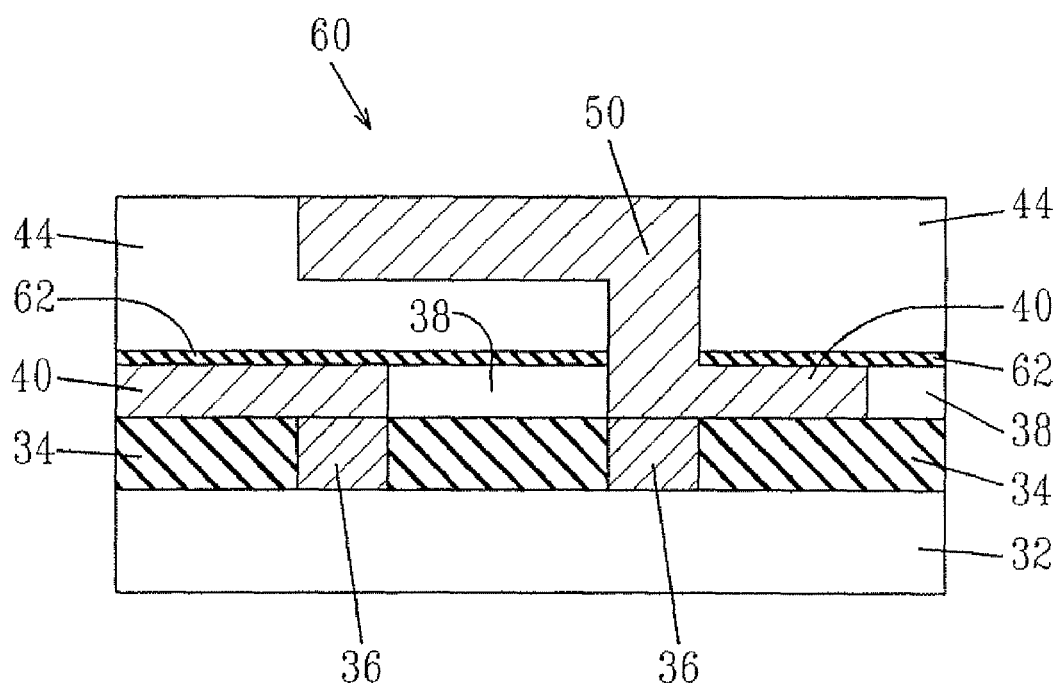
FIG. 6 is an enlarged, cross-sectional view of the electronic structure of FIG. 5 having an additional diffusion barrier dielectric cap layer deposited on top of the inventive SiCOH dielectric film.

FIG. 6 shows a present invention electronic device 60 similar to that of electronic device 30 shown in FIG. 5, but with an additional dielectric cap layer 62 deposited between the first insulating material layer 38 and the second insulating material layer 44. The dielectric cap layer 62 can be suitably formed of a material such as silicon oxide, silicon nitride, silicon oxynitride, silicon carbide, silicon carbo-nitride (SiCN), silicon carbo-oxide (SiCO), and their hydrogenated compounds. The additional dielectric cap layer 62 functions as a diffusion barrier layer for preventing diffusion of the first conductor layer 40 into the second insulating material layer 44 or into the lower layers, especially into layers 34 and 32.

Figure 7:
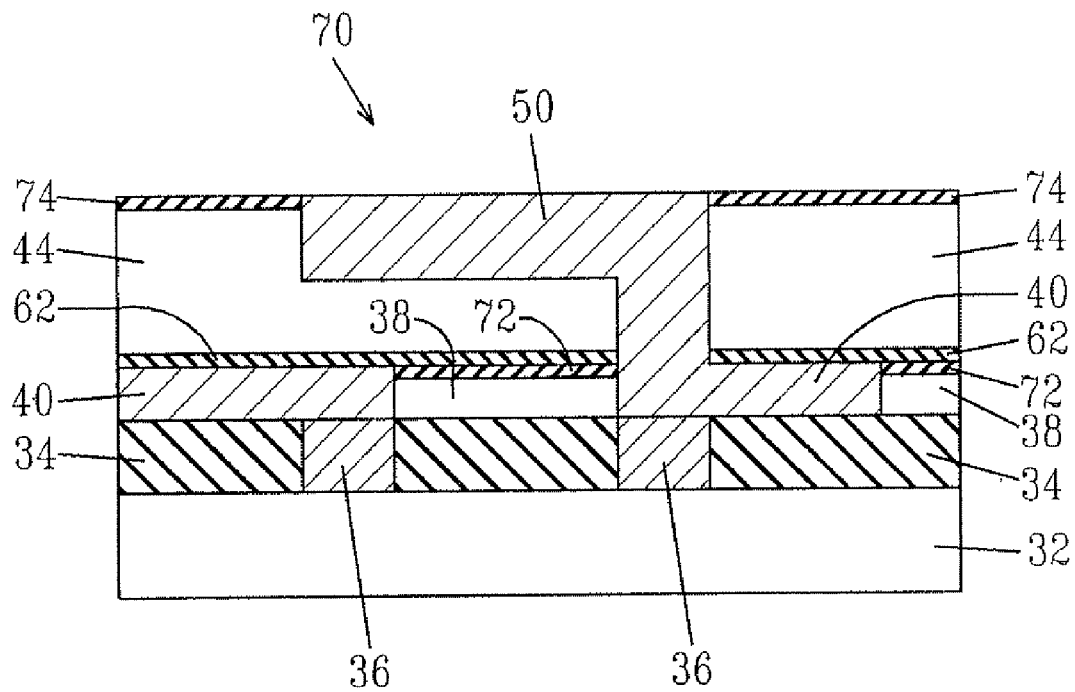
FIG. 7 is an enlarged, cross-sectional view of the electronic structure of FIG. 6 having an additional RIE hard mask/polish-stop dielectric cap layer and a dielectric cap diffusion barrier layer deposited on top of the polish-stop layer.

Another alternate embodiment of the present invention electronic device 70 is shown in FIG. 7. In the electronic device 70, two additional dielectric cap layers 72 and 74 which act as a RIE mask and CMP (chemical mechanical polishing) polish stop layer are used. The first dielectric cap layer 72 is deposited on top of the first ultra low k insulating material layer 38 and used as a RIE mask and CMP stop, so the first conductor layer 40 and layer 72 are approximately co-planar after CMP. The function of the second dielectric layer 74 is similar to layer 72, however layer 74 is utilized in planarizing the second conductor layer 50. The polish stop layer 74 can be deposited of a suitable dielectric material such as silicon oxide, silicon nitride, silicon oxynitride, silicon carbide, silicon carbo-oxide (SiCO), and their hydrogenated compounds. A preferred polish stop layer composition is SiCH or SiCOH for layers 72 or 74. A second dielectric layer can be added on top of the second SiCOH dielectric film 44 for the same purposes.

Figure 8:
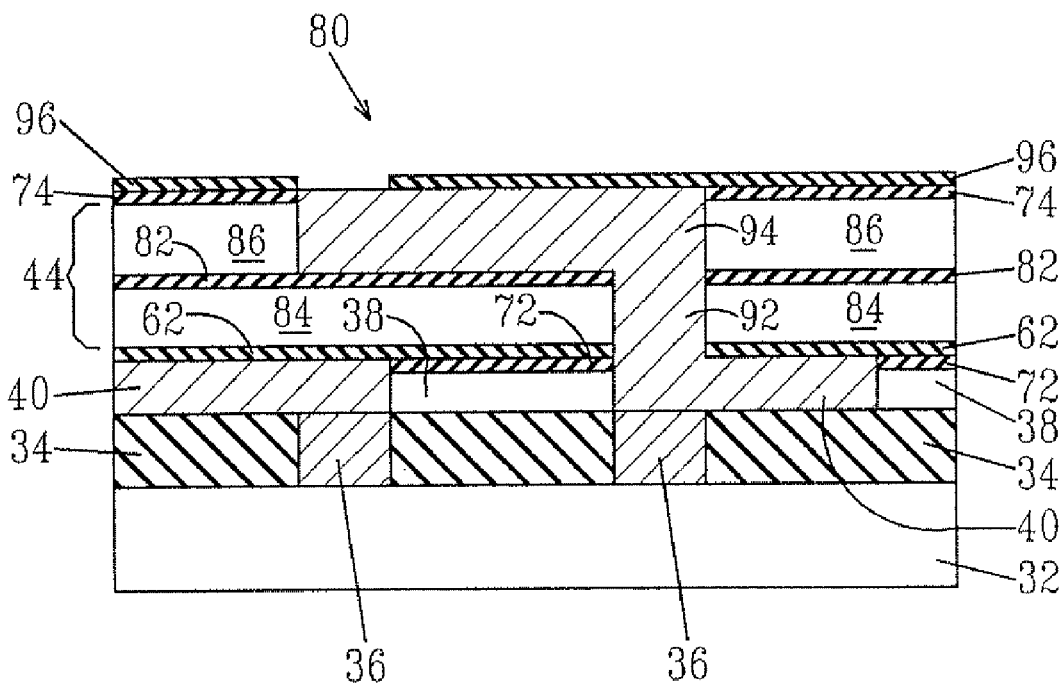
FIG. 8 is an enlarged, cross-sectional view of the electronic structure of FIG. 7 having additional RIE hard mask/polish-stop dielectric layers deposited on top of the SiCOH dielectric film of the present invention.

Still another alternate embodiment of the present invention electronic device 80 is shown in FIG. 8. In this alternate embodiment, an additional layer 82 of dielectric material is deposited and thus dividing the second insulating material layer 44 into two separate layers 84 and 86. The intralevel and interlevel dielectric layer 44 formed of the inventive ultra low k material is therefore divided into an interlayer dielectric layer 84 and an intralevel dielectric layer 86 at the boundary between via 92 and interconnect 94. An additional diffusion barrier layer 96 is further deposited on top of the upper dielectric layer 74. The additional benefit provided by this alternate embodiment electronic structure 80 is that dielectric layer 82 acts as an RIE etch stop providing superior interconnect depth control. Thus, the composition of layer 82 is selected to provide etch selectivity with respect to layer 86.

Still other alternate embodiments may include an electronic structure which has layers of insulating material as intralevel or interlevel dielectrics in a wiring structure that includes a pre-processed semiconducting substrate which has a first region of metal embedded in a first layer of insulating material, a first region of conductor embedded in a second layer of the insulating material wherein the second layer of insulating material is in intimate contact with the first layer of insulating material, and the first region of conductor is in electrical communication with the first region of metal, a second region of conductor in electrical communication with the first region of conductor and is embedded in a third layer of insulating material, wherein the third layer of insulating material is in intimate contact with the second layer of insulating material, a first dielectric cap layer between the second layer of insulating material and the third layer of insulating material and a second dielectric cap layer on top of the third layer of insulating material, wherein the first and the second dielectric cap layers are formed of a material that includes atoms of Si, C, O and H, or preferably a SiCOH dielectric film of the present invention.

Still other alternate embodiments of the present invention include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor that is in electrical communication with the first region of conductor and is embedded in a third layer of insulating material, the third layer of insulating material is in intimate contact with the second layer of insulating material, and a diffusion barrier layer formed of the dielectric film of the present invention deposited on at least one of the second and third layers of insulating material.

Still other alternate embodiments include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a reactive ion etching (RIE) hard mask/polish stop layer on top of the second layer of insulating material, and a diffusion barrier layer on top of the RIE hard mask/polish stop layer, wherein the RIE hard mask/polish stop layer and the diffusion barrier layer are formed of the SiCOH dielectric film of the present invention.

Still other alternate embodiments include an electronic structure which has layers of insulating materials as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a first RIE hard mask, polish stop layer on top of the second layer of insulating material, a first diffusion barrier layer on top of the first RIE hard mask/polish stop layer, a second RIE hard mask/polish stop layer on top of the third layer of insulating material, and a second diffusion barrier layer on top of the second RIE hard mask/polish stop layer, wherein the RIE hard mask/polish stop layers and the diffusion barrier layers are formed of the SiCOH dielectric film of the present invention.

Still other alternate embodiments of the present invention includes an electronic structure that has layers of insulating material as intralevel or interlevel dielectrics in a wiring structure similar to that described immediately above but further includes a dielectric cap layer which is formed of the SiCOH dielectric material of the present invention situated between an interlevel dielectric layer and an intralevel dielectric layer.

Figure 9:
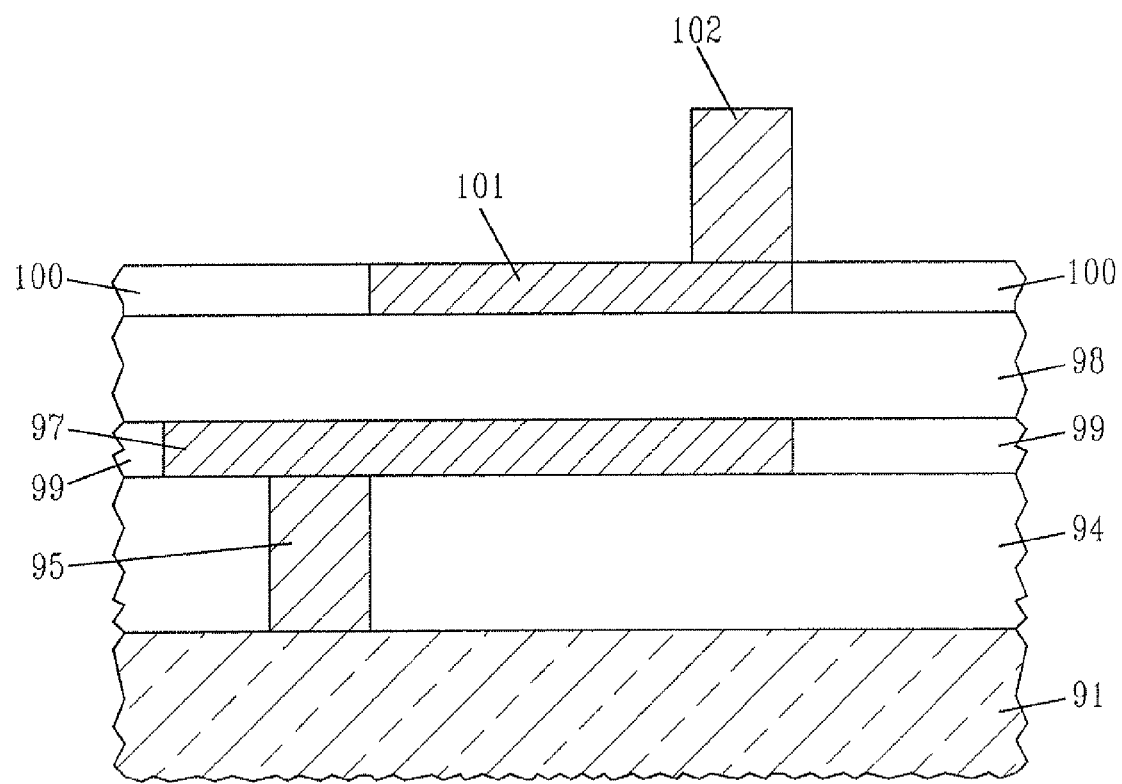
FIG. 9 is a pictorial representation (through a cross sectional view) illustrating an electronic structure including at least two conductors and the inventive SiCOH dielectric material.

In some embodiments as shown, for example in FIG. 9, an electronic structure containing at least two metallic conductor elements (labeled as reference numerals 97 and 101) and a SiCOH dielectric material (labeled as reference numeral 98). Optionally, metal contacts 95 and 102 are used to make electrical contact to conductors 97 and 101. The inventive SiCOH dielectric 98 provides electrical isolation and low capacitance between the two conductors. The electronic structure is made using a conventional technique that is well known to those skilled in the art such as described, for example, in U.S. Pat. No. 6,737,727, the entire content of which is incorporated herein by reference.

The at least two metal conductor elements are patterned in a shape required for a function of a passive or active circuit element including, for example, an inductor, a resistor, a capacitor, or a resonator.

Figure 10A:
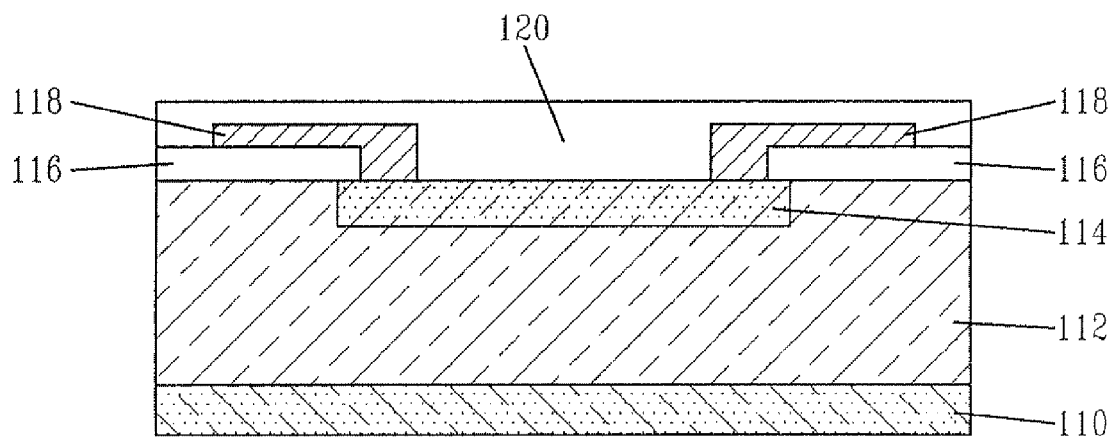
FIGS. 10A-10B are pictorial representations (through cross sectional views) illustrating electronic structures including a sensing element and the inventive SiCOH dielectric material.
Figure 10B:
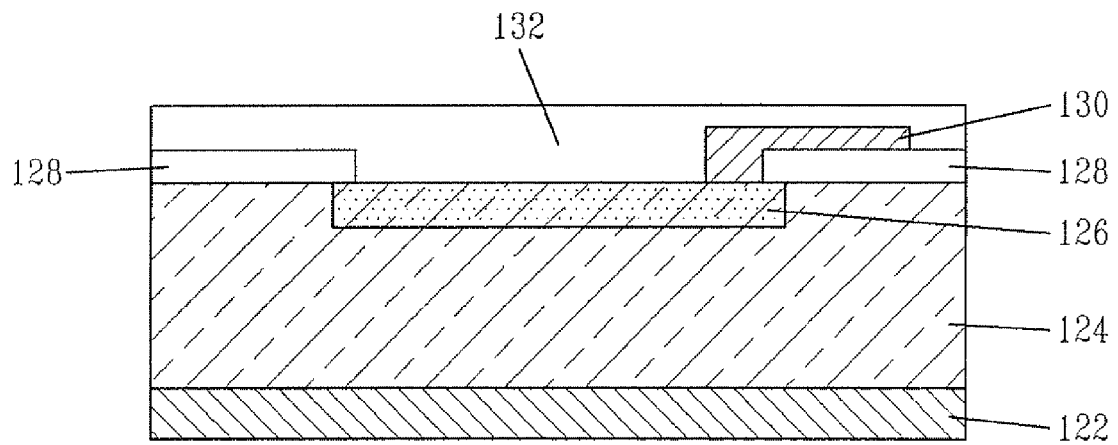

Additionally, the inventive SiCOH can be used in an electronic sensing structure wherein the optoelectronic sensing element (detector) shown in FIG. 10A or 10B is surrounded by a layer of the inventive SiCOH dielectric material. The electronic structure is made using a conventional technique that is well known to those skilled in the art. Referring to FIG. 10A, a p-i-n diode structure is shown which can be a high speed Si based photodetector for IR signals. The n+ substrate is 110, and atop this is an intrinsic semiconductor region 112, and within region 112 p+ regions 114 are formed, completing the p-i-n layer sequence. Layer 116 is a dielectric (such as $SiO_2$) used to isolate the metal contacts 118 from the substrate. Contacts 118 provide electrical connection to the p+ regions. The entire structure is covered by the inventive SiCOH dielectric material, 120. This material is transparent in the IR region, and serves as a passivation layer.

A second optical sensing structure is shown in FIG. 10B, this is a simple p-n junction photodiode, which can be a high speed IR light detector. Referring to FIG. 10B, the metal contact to substrate is 122, and atop this is an n-type semiconductor region 124, and within this region p+ regions 126 are formed, completing the p-n junction structure. Layer 128 is a dielectric (such as $SiO_2$) used to isolate the metal contacts 130 from the substrate. Contacts 130 provide electrical connection to the p+ regions. The entire structure is covered by the inventive SiCOH dielectric material, 132. This material is transparent in the IR region, and serves as a passivation layer.

A second optical sensing structure is shown in FIG. 11B, this is a simple p-n junction photodiode, which can be a high speed IR light detector. Referring to FIG. 11B, the metal contact to substrate is 122, and atop this is an n-type semiconductor region 124, and within this region p+ regions 126 are formed, completing the p-n junction structure. Layer 128 is a dielectric (such as $SiO_2$) used to isolate the metal contacts 130 from the substrate. Contacts 130 provide electrical connection to the p+ regions. The entire structure is covered by the inventive SiCOH dielectric material, 132. This material is transparent in the IR region, and serves as a passivation layer.

While the present invention has been described in an illustrative manner, it should be understood that the terminology used is intended to be in a nature of words of description rather than of limitation. Furthermore, while the present invention has been described in terms of a preferred and several alternate embodiments, it is to be appreciated that those skilled in the art will readily apply these teachings to other possible variations of the invention.

What is claimed is:

1. A method of fabricating a SiCOH dielectric material comprising:
    placing a substrate into a reactor;
    providing at least a first gas precursor containing atoms of Si, C, O and H, said first gas precursor comprising a carbosilane or alkoxycarbosilane molecule containing Si—$CH_2$—Si bonding; and
    depositing a dielectric film derived from said first gas precursor by chemical vapor deposition onto said substrate by selecting conditions that are effective in providing a SiCOH dielectric having dielectric constant of 3.2 or less, wherein the dielectric film comprises at least atoms of Si, C, O, H and has a covalently bonded tri-dimensional network structure in which a fraction of the C atoms are bonded as Si—$CH_3$ functional groups, and another fraction of the C atoms are bonded as Si—R—Si, wherein R is phenyl, —$[CH_2]_n$— where n is greater than or equal to 1, HC=CH, C=$CH_2$, C≡C or a $[S]_n$ linkage, where n is a defined above.

2. The method of claim 1 wherein said first gas precursor is a cyclic carbosilane molecule in which bonds forming the cyclic portion of the molecule include both Si—$CH_2$—Si bonds and at least one Si-bond.

3. The method of claim 2 wherein said first gas precursor is a derivative of disilacyclooctane, tetrasilacyclooctane, disilacyclohexane, or silacyclohexane.

4. The method of claim 2 wherein said first gas precursor comprises one of octamethyl-1,5-disiloxane-3,7-disilacyclooctane, 1,3,5,7-tetramethyl-1,5-disiloxane-3,7-disilacyclooctane, 1,3,5,7-tetramethyl-1,3,5,7-tetrasilacyclooctane, 1,3,5-trimethyl-1,3,5-trisilacyclohexane, 1,3,5-trimethyl-1,3-disiloxane-5-silacyclohexane, or 1,3,5-trimethyl-1-siloxane-3,5-disilacyclohexane.

5. The method of claim 2 further comprising adding a porogen precursor to said first gas precursor.

6. The method of claim 2 further comprising treating said deposited dielectric film with at least one energy source which comprises a thermal energy source, UV light, electron beam, chemical, microwave or plasma.

7. The method of claim 6 wherein the at least one energy source is a UV light, that may be pulsed or continuous, and said step of treating is performed at a substrate temperature from 300°-450° C., and with light that includes at least a UV wavelength between 150-370 nm.

8. The method of claim 2 further comprising a step of applying a source of energy to said reactor between said providing and depositing steps.

9. The method of claim 2 further comprising adding at least one of an inert gas or an oxidizing agent to said first gas precursor.

10. The method of claim 1 wherein said first gas precursor is selected from the group consisting of octamethyl-1,5-disiloxane-3,7-disilacyclooctane, 1,3,5,7-tetramethyl-1,5-disiloxane-3,7-disilacyclooctane, 1,3,5,7-tetramethyl-1,3,5,7- tetrasilacyclooctane, 1,3,5-trimethyl-1,3,5-trisilacyclohexane, 1,3,5-trimethyl-1,3-disiloxane-5-silacyclohexane, 1,3,5-trimethyl-1-siloxane-3,5-disilacyclohexane, 1,1,3,3,-tetrahydrido-1,3-disilacyclobutane, 1,1,3,3-tetramethoxy(ethoxy)-1,3 disilacyclobutane, 1,3-dimethyl-1,3-dimethoxy-1,3 disilacyclobutane, 1,3-disilacyclobutane, 1,3-dimethyl-1,3-dihydrido-1,3-disilylcyclobutane, 1,1,3,3, tetramethyl-1,3-disilacyclobutane, 1,1,3,3,5,5-hexamethoxy-1,3,5-trisilane, 1,1,3,3,5,5-hexahydrido-1,3,5-trisilane, 1,1,3,3,5,5-hexamethyl-1,3,5-trisilane, 1,1,1,3,3,3-hexamethoxy(ethoxy)-1,3-disilapropane, 1,1,3,3-tetramethoxy-1-methyl-1,3-disilabutane, 1,1,3,3-tetramethoxy-1,3-disilapropane, 1,1,1,3,3,3-hexahydrido-1,3-disilapropane, 3-(1,1-dimethoxy-1-silaethyl)-1,4,4-trimethoxy-1-methyl-1,4-disilpentane, methoxymethane, 2-(dimethoxysilamethyl)-1,1,4-trimethoxy-1,4-disilabutane, methoxymethane, 1,1,4-trimethoxy-1,4-disila-2-(trimethoxysilylmethyl)butane, dimethoxymethane, methoxymethane, 1,1,1,5,5,5-hexamethoxy-1,5-disilapentane, 1,1,5,5-tetramethoxy-1,5-disilahexane, 1,1,5,5-tetramethoxy-1,5-disilapentane, 1,1,1,4,4,4-hexamethoxy(ethoxy)-1,4-disilylbutane, 1,1,1,4,4,4,-hexahydrido-1,4-disilabutane, 1,1,4,4-tetramethoxy(ethoxy)-1,4-dimethyl-1,4-disilabutane, 1,4-bis-trimethoxy(ethoxy)silyl benzene,1,4-bis-dimethoxymethylsilyl benzene, 1,4-bis-trihydrosilyl benzene, 1,1,1,4,4,4-hexamethoxy(ethoxy)-1,4-disilabut-2-ene, 1,1,1,4,4,4-hexamethoxy(ethoxy)-1,4-disilabut-2-yne, 1,1,3,3-tetramethoxy(ethoxy)-1,3-disilolane, 1,3-disilolane, 1,1,3,3-tetramethyl-1,3-disilolane, 1,3,3-tetramethoxy(ethoxy)-1,3-disilane, 1,3-dimethoxy(ethoxy)-1,3-dimethyl-1,3-disilane, 1,3-disilane, 1,3-dimethoxy-1,3-disilane, 1,1-dimethoxy(ethoxy)-3,3-dimethyl-1-propyl-3-silabutane, and 2-silapropane.

11. The method of claim 1 further comprising treating said deposited dielectric film with at least one energy source which comprises a thermal energy source, UV light, electron beam, chemical, microwave or plasma.

12. The method of claim 11 wherein the at least one energy source is a UV light, that may be pulsed or continuous, and said step of treating is performed at a substrate temperature from 300°-450° C., and with light that includes at least a UV wavelength between 150-370 nm.

13. The method of claim 1 further comprising a step of adjusting a temperature of the substrate prior to providing said first gas precursor.

14. The method of claim 1 further comprising a step of applying a source of energy to said reactor between said providing and depositing steps.

15. The method of claim 1 further comprising providing a second precursor that comprises atoms of C, H and optionally at least one of O, F or N and Ge.

16. The method of claim 1 further comprising adding a porogen precursor to said first gas precursor.

17. The method of claim 1 further comprising adding at least one of an inert gas or an oxidizing agent to said first gas precursor.

18. The method of claim 1 further comprising providing a second precursor comprised of atoms of Si, C, O and H and selected from the group consisting of diethoxymethylsilane, dimethyldimethoxysilane, octamethylcyclotetrasiloxane, tetramethylcyclotetrasiloxane, vinylmethyldiethoxysilane, vinyltriethoxysilane, vinyldimethylethoxysilane, cyclohexenylethyltriethoxysilane, 1,1-diethoxy-1-silacyclopent-3-ene, divinyltetramethyldisiloxane, 2-(3,4-epoxycyclohexyl)ethyltriethoxysilane, 2-(3,4-epoxycyclohexyl)ethyltrimethoxysilane, epoxyhexyltriethoxysilane, hexavinyldisiloxane, trivinylmethoxysilane, trivinylethoxysilane, vinylmethylethoxysilane, vinylmethyldiethoxysilane, vinylmethyldimethoxysilane, vinylpentamethyldisiloxane, vinyltetramethyldisiloxane, vinyltriethoxysilane, and vinyltrimethoxysilane.

19. The method of claim 1 wherein said first gas precursor is an alkoxycarbosilane, said alkoxycarbosilane having a structural formula of:

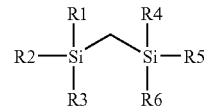

in which R1-R6 may be the same or different and are selected from the group consisting of H, —CH$_3$, —OCH$_3$ and —OCH$_2$CH$_3$.

20. The method of claim 1 wherein said first gas precursor is an alkoxycarbosilane, said alkoxycarbosilane having a structural formula of:

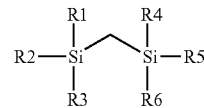

in which R1-R6 are —CH$_3$ or —OCH$_3$.

21. The method of claim 1 wherein said first gas precursor is an alkoxycarbosilane, said alkoxycarbosilane having a structural formula of:

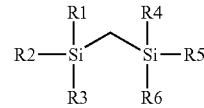

in which R1, R2, R3 and R4 are —CH$_3$, and R5 and R6 are —OCH$_3$.

22. The method of claim 1 wherein said first gas precursor is an alkoxycarbosilane, said alkoxycarbosilane having a structural formula of:

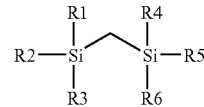

in which R1, R2, R4 and R5 are H or —CH$_3$, and R3 and R6 are —OCH$_3$.

23. A method of fabricating a SiCOH dielectric material comprising:
  placing a substrate into a reactor;
  providing at least a first gas precursor containing atoms of Si, C, O and H, said first gas precursor comprising a cyclic carbosilane molecule in which bonds forming the cyclic ring comprise both Si—CH$_2$—Si bonds and at least one Si-bond; and
  depositing by chemical vapor deposition a dielectric film derived from said first gas precursor onto said substrate by selecting conditions that are effective in providing a SiCOH dielectric having dielectric constant of 3.2 or less, wherein the dielectric film comprises at least atoms of Si, C, O, H and has a covalently bonded tri-dimensional network structure in which a fraction of the C atoms are bonded as Si—$CH_3$ functional groups, and another fraction of the C atoms are bonded as Si—R—Si, wherein R is phenyl, —$[CH_2]_n$— where n is greater than or equal to 1, HC=CH, C=$CH_2$, C≡C or a $[S]_n$ linkage, where n is a defined above.

24. The method of claim 23 wherein said first gas precursor comprises one of octamethyl-1,5-disiloxane-3,7-disilacyclooctane, 1,3,5,7-tetramethyl-1,5-disiloxane-3,7-disilacyclooctane, 1,3,5,7-tetramethyl-1,3,5,7-tetrasilacyclooctane, 1,3,5-trimethyl-1,3,5-trisilacyclohexane, 1,3,5-trimethyl-1,3-disiloxane-5-silacyclohexane, or 1,3,5-trimethyl-1-siloxane-3,5-disilacyclohexane.

* * * * *